United States Patent
Chen et al.

(10) Patent No.: US 10,388,806 B2
(45) Date of Patent: Aug. 20, 2019

(54) PHOTONIC LOCK BASED HIGH BANDWIDTH PHOTODETECTOR

(71) Applicant: Artilux, Inc., Zhubei (TW)

(72) Inventors: Shu-Lu Chen, Zhubei (TW); Yun-Chung Na, Zhubei (TW)

(73) Assignee: Artilux, Inc., Zhubei (TW)

( * ) Notice: Subject to any disclaimer, the term of this patent is extended or adjusted under 35 U.S.C. 154(b) by 256 days.

(21) Appl. No.: 14/998,053

(22) Filed: Dec. 24, 2015

(65) Prior Publication Data

US 2016/0204285 A1    Jul. 14, 2016

Related U.S. Application Data

(63) Continuation-in-part of application No. 14/298,825, filed on Jun. 6, 2014, now Pat. No. 9,362,428, which
(Continued)

(51) Int. Cl.
  *H01L 31/18*    (2006.01)
  *H01L 31/102*   (2006.01)
  *H01L 31/0232*  (2014.01)

(52) U.S. Cl.
  CPC ...... *H01L 31/02327* (2013.01); *H01L 31/102* (2013.01); *H01L 31/18* (2013.01)

(58) Field of Classification Search
  CPC ......... G01T 1/241; G01T 1/2928; G01T 1/24; G01T 1/00; G01T 1/202; G01T 1/2023;
(Continued)

(56) References Cited

U.S. PATENT DOCUMENTS

| 3,622,319 A | 11/1971 | Sharp et al. |
| 4,592,043 A | 5/1986 | Williams |

(Continued)

FOREIGN PATENT DOCUMENTS

| CN | 1652326 A | 8/2005 |
| CN | 1780004 A | 5/2006 |

(Continued)

OTHER PUBLICATIONS

Ünlü and Strite, "Resonant cavity enhanced photonic devices", 1995, American Institute of Physics, J. Appl. Phys. 78 (2), pp. 607-639.*
(Continued)

*Primary Examiner* — David P Porta
*Assistant Examiner* — Blake C Riddick
(74) *Attorney, Agent, or Firm* — Perkins Coie LLP

(57) ABSTRACT

The technique introduced herein decouples the traditional relationship between bandwidth and responsivity, thereby providing a more flexible and wider photodetector design space. In certain examples of the technique introduced here, a photodetector device includes a first mirror, a second mirror, and a light absorption region positioned between the first and second reflective mirrors. For example, the first mirror can be a low-reflectivity mirror, and the second mirror can be a high-reflectivity mirror. The light absorption region is positioned to absorb incident light that is passed through the first mirror and reflected between the first and second mirrors. The first mirror can be configured to exhibit a reflectivity that causes an amount of light energy that escapes from the first mirror, after the light being reflected back by the second mirror, to be zero or near zero.

13 Claims, 20 Drawing Sheets

Related U.S. Application Data is a continuation-in-part of application No. 13/709,209, filed on Dec. 10, 2012, now abandoned.

(58) Field of Classification Search
 CPC .......... H01S 5/105; H01S 5/183; H01S 5/026; H01S 5/0265; B82Y 20/00; H01L 31/0232; H01L 31/18; H01L 31/102; H01L 33/105
 USPC ...... 250/371, 370.01, 370.09, 370.12, 336.1, 250/214.1, 214 R
 See application file for complete search history.

(56) References Cited

U.S. PATENT DOCUMENTS

| | | | |
|---|---|---|---|
| 5,291,055 | A | 3/1994 | Farhoomand et al. |
| 5,315,128 | A | 5/1994 | Hunt et al. |
| 5,343,542 | A | 8/1994 | Kash et al. |
| 5,355,216 | A | 10/1994 | Kim et al. |
| 5,389,797 | A | 2/1995 | Bryan et al. |
| 5,455,421 | A | 10/1995 | Spears |
| 5,525,828 | A * | 6/1996 | Bassous ............ H01L 31/02024 257/449 |
| 5,783,364 | A | 7/1998 | Ellis et al. |
| 6,172,408 | B1 * | 1/2001 | Seto ................ H01L 31/022408 257/458 |
| 6,218,719 | B1 | 4/2001 | Tsang et al. |
| 6,349,106 | B1 | 2/2002 | Coldren et al. |
| 6,836,574 | B2 | 12/2004 | Yamada et al. |
| 7,446,297 | B1 | 11/2008 | Sigel et al. |
| 7,535,944 | B1 | 5/2009 | Guilfoyle et al. |
| 8,058,549 | B2 | 11/2011 | Khazeni et al. |
| 8,330,956 | B1 | 12/2012 | Seletskiy et al. |
| 2003/0047752 | A1 | 3/2003 | Campbell et al. |
| 2003/0231683 | A1 | 12/2003 | Chua et al. |
| 2004/0096574 | A1 | 5/2004 | Hsieh et al. |
| 2005/0002604 | A1 | 1/2005 | Verbrugge et al. |
| 2005/0226294 | A1 | 10/2005 | Ledentsov et al. |
| 2006/0013591 | A1 | 1/2006 | Rohde et al. |
| 2007/0019917 | A1 | 1/2007 | Bayindir et al. |
| 2007/0041414 | A1 | 2/2007 | Albrecht et al. |
| 2007/0086018 | A1 | 4/2007 | Shih et al. |
| 2007/0104441 | A1 | 5/2007 | Ahn et al. |
| 2007/0159638 | A1 | 7/2007 | Zeng et al. |
| 2007/0273887 | A1 | 11/2007 | Russell et al. |
| 2008/0181277 | A1 | 7/2008 | Konig et al. |
| 2009/0078973 | A1 | 3/2009 | Hsu et al. |
| 2009/0121305 | A1 | 5/2009 | Pan et al. |
| 2009/0273049 | A1 | 11/2009 | Fattal et al. |
| 2010/0006967 | A1 | 1/2010 | Ishimura et al. |
| 2011/0116095 | A1 | 5/2011 | Krol et al. |
| 2011/0120538 | A1 * | 5/2011 | Lochtefeld .......... H01L 31/0745 136/255 |
| 2012/0018744 | A1 | 1/2012 | Dosunmu et al. |
| 2012/0077680 | A1 | 3/2012 | Berggren et al. |
| 2013/0164892 | A1 * | 6/2013 | Sugawara ........... H01L 29/6675 438/158 |
| 2014/0090976 | A1 | 4/2014 | Rotschild et al. |
| 2014/0159183 | A1 | 6/2014 | Na et al. |
| 2014/0239301 | A1 | 8/2014 | Huang et al. |
| 2014/0246571 | A1 | 9/2014 | Li et al. |
| 2014/0284450 | A1 | 9/2014 | Chen et al. |

FOREIGN PATENT DOCUMENTS

| | | |
|---|---|---|
| CN | 1812302 A | 8/2006 |
| JP | H11507178 A | 6/1999 |
| JP | 2003504677 A | 2/2003 |
| TW | 201421653 A | 6/2014 |

OTHER PUBLICATIONS

Cai, M., "Observation of critical coupling in a fiber taper to a silica-microsphere whispering-gallery mode system," Phys. Rev. Lett. 85(1), 74-77 (2000).
Carline et al.: "Long-wavelength SiGe/Si resonant cavity infrared detector using a bonded silicon-on-oxide reflector," 1996, Applied Physics Letters, vol. 68, pp. 544-546.
Chen, C.-H., et al., "Resonant-cavity-enhanced p-i-n photodiode with a broad quantumefficiency spectrum by use of an anomalous-dispersion mirror," Appl. Opt. 44(29), 6131-6140 (2005).
Colace, L., "Germanium near infrared detector in Silicon on insulator," Appl. Phys. Lett. 91(2), 021107 (2007).
DeRose, C.T., et al.,"Ultra compact 45 GHz CMOS compatible Germanium waveguide photodiode with low dark current," Opt. Express 19(25), 24897-24904 (2011).
Dosunmu, O. I., et al., "High-speed resonant cavity enhanced Ge photodetectors on reflecting Si substrates for 1550-nm operation," IEEE Photon. Technol. Lett. 17(1), 175-177 (2005).
Emsley, M. K., "High-speed resonant-cavity-enhanced Silicon photodetectors on reflecting Silicon-on-insulator substrates," IEEE Photon. Technol. Lett. 14(4), 519-521 (2002).
Extended European Search Report dated Jun. 15, 2015, for European Patent Publication No. 2 889 917 A2, published Jul. 1, 2015, 9 pages.
Extended European Search Report dated Jun. 29, 2015, for European Patent Application No. 14200338.3 filed Dec. 24, 2014, 9 pages.
Feng, D., et al., "High-speed Ge photodetector monolithically integrated with large crosssection Silicon-on-insulator waveguide," Appl. Phys. Lett. 95(26), 261105 (2009).
Final Office Action dated Jun. 9, 2015, for U.S. Appl. No. 14/298,825, of Chen, S.L., filed Jun. 6, 2014.
Joo, J. et al., "High-sensitivity 10 Gbps Ge-on-Si photoreceiver operating at I~1.55 mm," Opt. Express 18(16), 16474-16479 (2010).
Kishino, K., "Resonant cavity-enhanced (RCE) photodetectors," IEEE J. Quantum Electron. 27(8), 2025-2034 (1991).
Klinger, S., et al., "Ge-on-Si p-i-n photodiodes with a 3-Db bandwidth of 49 GHz," IEEE Photon. Technol. Lett. 21(13), 920-922 (2009).
Li et al.: "Si 1-x Ge x/Si resonant-cavity-enhanced photodetectors with a silicon-on-oxide reflector operating near 1.3 μm," 2000, Applied Physics Letters, vol. 77, pp. 157-159.
Michel, J., et al., "High-performance Ge-on-Si photodetectors," Nat. Photonics 4(8), 527-534 (2010).
Morse, M., et al., "Performance of Ge-on-Si p-i-n photodetectors for standard eeceiver modules," IEEE Photon. Technol. Lett. 18(23), 2442-2444 (2006).
Non-Final Office Action dated Dec. 31, 2014, for U.S. Appl. No. 14/298,825, of Chen, S.L., filed Jun. 6, 2014.
Non-Final Office Action dated Jun. 13, 2014, for U.S. Appl. No. 13/709,209, filed Dec. 10, 2012, now abandoned.
Notice of Allowance dated Apr. 11, 2016, for U.S. Appl. No. 14/298,825, of Chen, S.L., filed Jun. 6, 2014.
Notice of Allowance dated Dec. 24, 2015, for U.S. Appl. No. 14/298,825, of Chen, S.L., filed Jun. 6, 2014.
Osmond, J., et al., "40 Gb/s surface-illuminated Ge-on-Si photodetectors," Appl. Phys. Lett. 95(15), 151116 (2009).
Rouviere,M., et al.: "Integration of germanium waveguide photodectors for intrachip optical interconnects," Optical Engineering, vol. 44, No. 7, Jul. 18, 2005, pp. 075402-1.
Tseng, C.-K., et al., "Selfaligned microbonded Ge/Si PIN waveguide photodetector," post-deadline session, 9th IEEE International Conference on Group IV Photonics (GFP), Aug. 29-31, 2012).
Ünlü, M. S., et al., "Resonant Cavity Enhanced Photonic Devices", American Institute of Physics, J. Applied Reviews 78 (2), Jul. 15, 1995, 607-639.
Wu, T.-T., et al., "A critically coupled Germanium photodetector under vertical illumination," Optics express 20, (28) 29338-29346 (2012).
Yariv, A., "Critical coupling and its control in optical waveguide-ring resonator systems," IEEE Photon. Technol. Lett. 14(4), 483-485 (2002).

(56) References Cited

OTHER PUBLICATIONS

Yin, T., et al., "31 GHz Ge n-i-p waveguide photodetectors on Silicon-on-Insulator substrate," Opt. Express 15(21), 13965-13971 (2007).
Yu, H., et al., "High-efficiency p-i-n photodetectors on selective-area-grown Ge for monolithic integration," IEEE Electron Device Lett. 30(11), 1161-1163 (2009).
Final Office Action dated Mar. 29, 2018, for U.S. Appl. No. 14/298,825, of Chen, S.L., filed Jun. 6, 2014.
Notification of Reasons for Refusal dated Feb. 16, 2018 for Japanese Patent Application No. JP 2014-265530, 6 pages.
De Stefano, L. et al., "Low-cost VLSI-compatible resonant-cavity-enhanced p-i-n in micron-Si operating at the VCSEL wavelengths around 850 nm", Proc. SPIE, vol. 5117, pp. 428-433, 2003.
Li, Cheng et al., "SiGe/Si resonant-cavity-enhanced photodetectors for 1.3 μm operation fabricated using wafer bonding techniques", Journal of applied physics 92.3, 2002, pp. 1718-1720.
Kaniewski, J. et al., "Resonant cavity enhanced InGaAs photodiodes for high speed detection of 1.55 um infrared radiation", Proceedings vol. 5783, Infrared Technology and Applications XXXI, 2005; pp. 47-56; SPIE, Bellingham, WA., 2005.

\* cited by examiner

PHOTONIC LOCK BASED HIGH BANDWIDTH PHOTODETECTOR

PRIORITY CLAIMS

This application is a continuation-in-part application of U.S. patent application Ser. No. 14/298,825, entitled "PHOTONIC LOCK BASED HIGH BANDWIDTH PHOTODETECTOR," filed on Jun. 6, 2014, which is a continuation-in-part application of U.S. patent application Ser. No. 13/709,209, entitled "HIGH-EFFICIENCY BANDWIDTH PRODUCT GERMANIUM PHOTODETECTOR," filed on Dec. 10, 2012; all of which are incorporated by reference herein in their entireties.

TECHNICAL FIELD

At least one aspect of the present disclosure relates to photodetector designs, and more particularly, to photonic lock based high bandwidth photodetectors.

BACKGROUND

With the ever increasing demand for high speed communication, there has been a significant increase in the use of optics in computing systems. Semiconductor photonics, which can be implemented in an integrated circuit with known fabrication techniques, are increasingly deployed to meet the growing use of optics. The resulting semiconductor photodetectors have a small form factor, and their detection bandwidths can be very high. These traits make semiconductor photodetectors suitable for optical fiber based, high-speed telecommunication and datacenter interconnect applications.

However, in conventional photodetector designs, there is an inherent trade-off between responsivity and bandwidth. Traditionally, the responsivity is directly proportional to the path length that the light travels in the light absorption material (e.g., germanium). Considering a conventional normal incidence photodetector as an example, the thicker the absorption layer is, the higher the responsivity is. Unfortunately, a thicker absorption layer almost always features the drawback of longer carrier transit time that reduces the bandwidth of photodetectors.

BRIEF DESCRIPTION OF THE DRAWINGS

One or more aspects of the present disclosure are illustrated by way of example and not limitation in the figures of the accompanying drawings, in which like references indicate similar elements. These drawings are not necessarily drawn to scale.

DETAILED DESCRIPTION

Figure 1A:
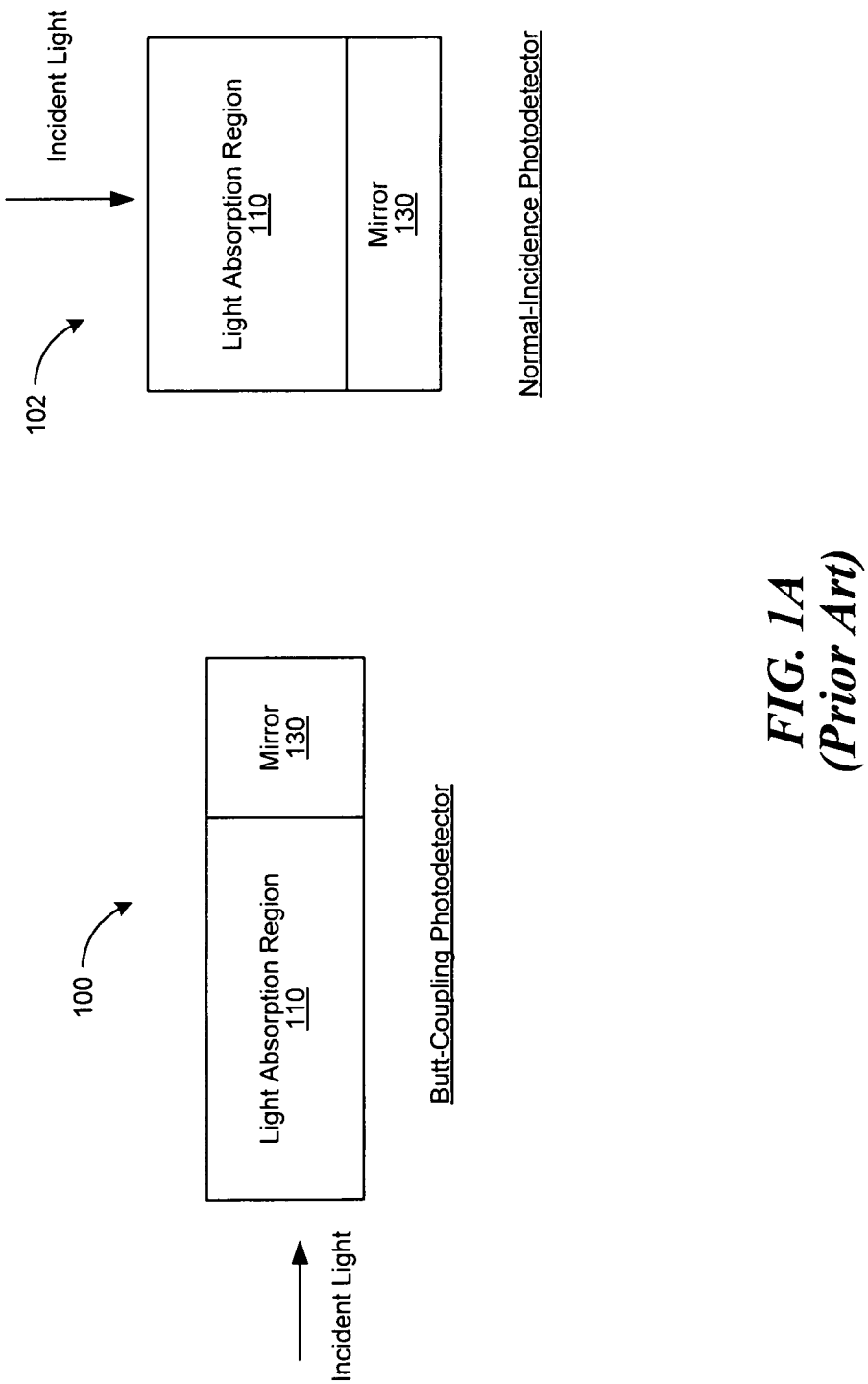
FIGS. 1A-1B illustrate cross-sectional views of conventional photodetector structures.
Figure 1B:
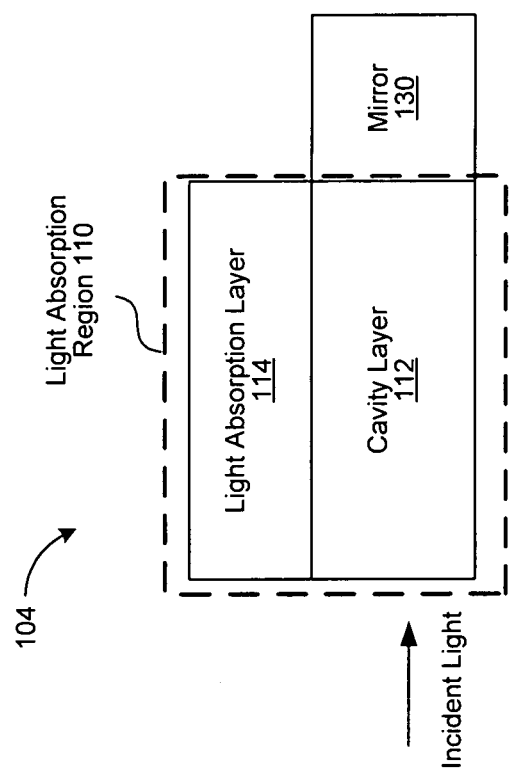

It is observed that the aforementioned trade-off between responsivity and bandwidth in conventional photodetector designs is undesirable. One conventional attempt to overcome this drawback is to place a mirror structure (or a reflective region) adjacent to the light absorption region to reflect the light back to the light absorption region. FIGS. 1A-1B illustrate the cross-sectional views of three different photodetector structures all implementing this conventional approach. Note that, in many parts of the following discussion, it is assumed that all of the incident light is nearly perfectly coupled into the light absorption region; in practice, an anti-reflection coating layer may be added to substantially satisfy this assumption. Also, note that the structures shown in FIGS. 1A-1B, as well as in other figures throughout this disclosure, are for illustration purposes only; consequently, certain well-known structures (e.g., substrate, contacts, doping profiles, and anti-reflection coating(s) for the incident light) may be omitted in one or more figures for simplicity. The three different types of photodetectors include a butt-coupling photodetector 100, a normal-incidence photodetector 102, and an evanescent-coupling photodetector 104.

As shown, incident light enters a light absorption region 110 of the photodetectors 100, 102, and 104 at one end of the light absorption region 110; a mirror structure (or a reflective region) 130 can be positioned at the other end of the light absorption region 110 to reflect the incident light back to the light absorption region 110. While this approach improves the responsivity because the incident light's travel path doubles, the improvement is limited. Also, adding the mirror 130 may cause well-known back-reflection issues, in part because the anti-reflection coating, which is a reciprocal structure. Notably, the function of the anti-reflection coating is to allow maximum light energy to be transferred between two mediums—here, from the medium carrying the incident light into the light absorption region and vice versa.

It is further observed that one important reason for this bandwidth and responsivity trade-off in the conventional photodetector designs is caused by the light not being confined inside the light absorption region 110, and henceforth the absorption of light can only take place during a limited amount of light passes.

Introduced here is a technique to overcome such trade-off by providing a way to confine the incident light in the light absorption region 110 for reaching high responsivity without sacrificing bandwidth. More specifically, by confining the incident light, the total volume (e.g., thickness) of the light absorption material can be greatly reduced without sacrificing much or even any responsivity, because the light remains within the light absorption region 110 (or light absorption cavity such as cavity layer 112 of FIG. 1B) until the light is absorbed by the light absorption material. This smaller size can bring the benefit of higher bandwidth.

As described further below, the apparatus and technique introduced herein decouple the traditional relationship between bandwidth and responsivity, thereby providing a more flexible and wider photodetector design space for next generation high-speed photodetector applications. In certain examples, a photodetector device includes a first mirror, a second mirror, and a light absorption region positioned between the first and second reflective mirrors. For example, the first mirror can be a partial mirror, and the second mirror can be a high-reflectivity mirror. The incident light can be guided from a waveguide, through the first mirror, and then enter the light absorption region. The light absorption region is positioned to absorb incident light that is passed through the first mirror and reflected between the first and second mirrors. The first mirror can be configured to exhibit a reflectivity that causes an amount of energy of light escaped from the first mirror, after being reflected back by the second mirror, to be zero or near zero. That is to say, in ways discussed herein, the present technique can configure the optical parameters of the first mirror together with the second mirror and the light absorption region such that a substantial amount of energy of the incident light can be captured by or confined within the light absorption region. In this way, examples incorporating the present technique can enjoy both high bandwidth and high responsivity. Some photodetector incorporating the present technique may achieve a bandwidth of over 40 Gbit/s as compared to 10-25 Gbit/s of traditional photodetectors. Also, the thickness (e.g., in a normal-incidence photodetector) or the length (e.g., in a butt-coupling photodetector) of the light absorption region may be reduced from 3 μm or thicker to around or below 500 nm.

Additionally, methods for designing a photonic lock based photodetector, which may be exemplified by an electronic design automation (EDA) software application, are discussed below.

In the following description, numerous specific details are set forth to provide a thorough understanding of the present disclosure. It will be apparent to one skilled in the art that the techniques introduced here may be practiced without these specific details. In other instances, well-known features, such as specific fabrication techniques, are not described in detail in order to not unnecessarily obscure the present disclosure. References in this description to "an example," "one example," or the like, mean that a particular feature, structure, material, or characteristic being described is included in at least one implementation of the present disclosure. Thus, the appearances of such phrases in this specification do not necessarily all refer to the same example. On the other hand, such references are not necessarily mutually exclusive either. Furthermore, the particular features, structures, materials, or characteristics may be combined in any suitable manner in one or more examples. Also, it is to be understood that the various exemplary implementations shown in the figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular examples, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

For example, the light absorption region 110 in FIG. 1B may be described herein as positioned "between" the incident light as shown and the mirror 130, even though not all portions of the light absorption region 110 (e.g., the light absorption layer 114) are directly located on the same planar surface (e.g., on top of a substrate) as the incident light and the mirror 130. For another example, the light absorption layer 114 in FIG. 1B may be described herein as disposed "over" the cavity layer 112, even though the light absorption layer 114 may not directly contact the cavity layer 112, such as the case where an interfacial layer (not shown in FIG. 1B) is sandwiched between the light absorption layer 114 and the cavity layer 112.

Also, except where otherwise indicated or made apparent from the context, some of the terms may be used herein interchangeably. For example, the term "round-trip" or "one-circulation" means that the light travels from a first end (e.g., of a light absorption region) to a second end, and then returns (e.g., as being reflected) from the second end back to the first end. The term "attenuation coefficient" or "absorption coefficient" of a light absorption region here is defined as the coefficient or constant representing, when light travels in the light absorption region, how much amount of light energy remains (in percentages as compared to the light's initial incident energy) after the light being attenuated inside the light absorption region.

The term "reflect" means that the reflectivity for an incident light beam in at least one specific wavelength range, for example, in the near infrared region, is greater than 0%.

Figure 2:
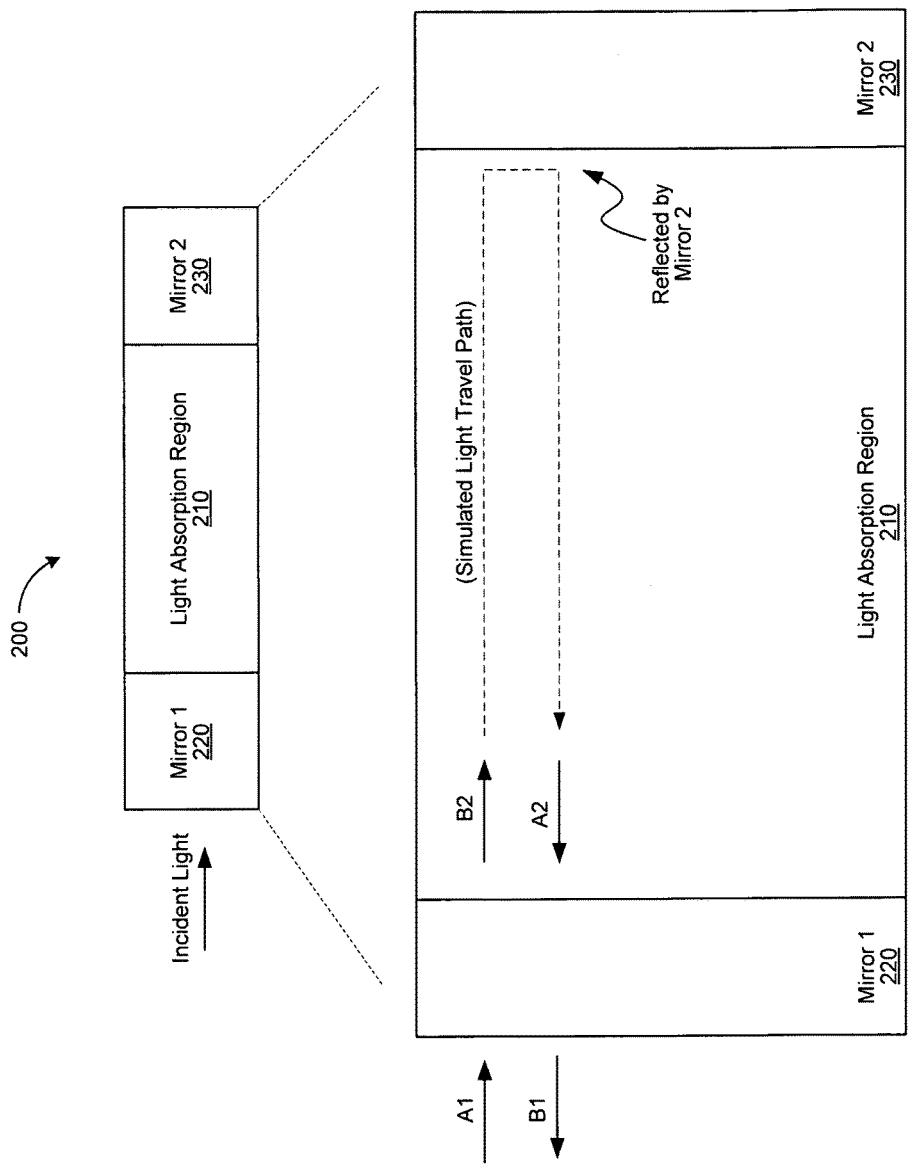
FIG. 2 illustrates a cross-sectional view showing relevant details of implementing a photonic lock based photodetector in accordance with some examples.

FIG. 2 illustrates a cross-sectional view showing relevant details of implementing a photonic lock based photodetector 200 in accordance with some aspects of the present technique. The photodetector 200 includes a light absorption region 210, a first mirror (or a reflective region) 220, and a second mirror 230. For purposes of explanation, the following discussion assumes that the photodetector 200 is a butt-coupling type photodetector; however, the technique introduced here can be applied to any suitable semiconductor photodetector.

As mentioned above, for a conventional photodetector, its light absorption region needs to be long enough within the incident light's travel direction in order to absorb enough light. This limitation places a bottleneck on the bandwidth such conventional photodetector can reach. Accordingly, the photodetector 200 includes a photonic lock mechanism to confine the light inside the light absorption region 210 so that the light stays in the light absorption region 210 until the light is completely or nearly completely absorbed by the light absorption material. To this end, one aspect of the technique is to position two mirrors (e.g., the first mirror 220 and the second mirror 230), one mirror on each side of the light absorption region 210, so as to form a photonic lock.

The photonic lock confines the incident light inside the light absorption region 210, and therefore the incident light can travel multiple times (by being reflected between the mirrors 220 and 230) inside the light absorption region 210 for almost all the light to be absorbed.

More specifically, in order to "lock" the light inside the light absorption region 210, the photonic lock is configured such that an amount of energy of light escaped from the first mirror 220, after being reflected back by the second mirror 230, is to be zero or near zero. In order to reach such lock condition, the optical parameters of the first mirror 220, together with that of the second mirror 230 and the light absorption region 210, are configured such that a substantial amount of energy of the incident light is captured by or confined within the light absorption region 210. In one or more examples, (a) a reflectivity of the first mirror 220, (b) a reflectivity of the second mirror 230, and (c) an attenuation coefficient of the light absorption region 210 are configured together such that, when the incident light enters the light absorption region 210 and reflects between the first mirror 220 and the second mirror 230, the light resonates and becomes substantially locked in the light absorption region 210. One example way to configure this photodetector is to design the reflectivity of the second mirror 230 to be as high as possible (close to 100%), and then based on the bandwidth requirement, design the dimension of the cavity (light absorption region in FIG. 2). Based on the dimension of the cavity and other material parameters, the one-circulation attenuation coefficient of the cavity is obtained and then the reflectivity of the first mirror 220 can be correlated to the one-circulation attenuation coefficient.

With reference to FIG. 2, some physical principles operating behind the photonic lock condition for implementing the photonic lock photodetectors are now described. As shown in FIG. 2, it is assumed that the incident light enters into the light absorption region 210 through the first mirror 220. Note that, according to certain aspects, the first mirror 220 is a partial reflector that allows a portion of the light (and its energy) transmitted into the cavity, and the second mirror 230 is a total reflector that reflects a majority of the light (and its energy) back into the light absorption region 210. As such, in one or more examples of the photodetector 200, the first mirror 220's reflectivity is smaller than the second mirror 230's reflectivity. In the following discussion, it is assumed that the second mirror 230 is a perfect reflector (i.e., its reflectivity reaches 100%) for simplicity. If the second mirror 230's reflectivity is less than perfect, the technique introduced here can still be effective; however, the efficiency may degrade due to the second mirror 230's imperfection. Also note that, although not depicted in FIG. 2, the light absorption region 210 may include one or more materials and/or structures. For example, in certain examples, the light absorption region 210 can employ a photodiode structure, a lateral or vertical p-i-n doping profile, or an avalanche photodiode structure.

Now, assuming that the transmissivity of the first mirror 220 is T, and that the reflectivity of the first mirror 220 is R1, then a scattering matrix (or an "S-matrix") can be used representing the steady state of the above-said structure when the incident light enters:

$$\begin{pmatrix} \sqrt{B1} \\ \sqrt{B2} \end{pmatrix} = \begin{pmatrix} -\sqrt{R1} & \sqrt{T} \\ \sqrt{T} & \sqrt{R1} \end{pmatrix} \begin{pmatrix} \sqrt{A1} \\ \sqrt{A2} \end{pmatrix} \quad \text{Eq. (1)}$$

where A1, A2, B1, and B2 each represent the optical intensity (or power) of the incident light at a different stage, as shown in FIG. 2.

Furthermore, because the law of conservation of energy, R1 and T has the following relationship:

$$R1 + T = 1 \quad \text{Eq. (2)}$$

Now, let $\alpha$ represent a one-circulation attenuation coefficient of the light absorption region 210. As used herein, the one-circulation attenuation coefficient of the light absorption region 210 represents how much light remains in the light absorption region 210 when the light travels from entering the light absorption region 210 to exiting the light absorption region 210, having been reflected by the second mirror 230, assuming the exiting point of the incident light is the same as the entry point.

Furthermore, let A2 represent the optical intensity of the incident light after being passed into the light absorption region 210, through the light absorption region 210, to the second mirror 230, and being reflected from the second mirror 230, through the light absorption region 210 again, to immediately before exiting the light absorption region 210. Then, A2 can be denoted by:

$$A2 = B2\alpha \quad \text{Eq. (3)}$$

In other words, when the light enters the light absorption region 210, $\alpha$ indicates the ratio of remainder light energy A2 over entrance light energy B2 in one circulation.

Note that, in some examples, $\alpha$ can be expressed as a function of R2, the reflectivity of the second mirror 230:

$$\alpha \approx R2 e^{-n_i k_0 4d} \quad \text{Eq. (4)}$$

where $n_i$ is the imaginary part of cavity refractive index, $k_0$ is the free-space wavenumber, and d is the cavity length (i.e., the distance between the first mirror 220 and the second mirror 230).

Note, however, that equation (4) may not be fully representative of certain cases where the size of the light absorption region 210 is smaller or similar to the optical wavelength of the incident light. In these cases, both the size of the light absorption region 210 (as compared to the optical wavelength) and the position of the light absorption region 210 (as being relative to the cavity field antinodes or nodes) may determine the effective light absorption coefficient. (A "node" is where the amplitude stays zero in a standing wave; an "antinode" is where the amplitude changes the most in a standing wave.)

For example, in some particular cases where the light absorption region 210's size is much smaller than the optical wavelength and the light absorption region 210's position is at the cavity field antinode, an effective absorption coefficient that is twice the value of its bulk absorption coefficient may be observed. (The term "bulk" refers to a material's general material properties, which may be deviated when the material physical size is too small such as the conditions being discussed here.) Conversely, where the light absorption region 210's size is much smaller than the optical wavelength and the light absorption region 210's position is at the cavity field node, an effective absorption coefficient of zero may be observed.

According to the technique introduced here, a substantial amount of energy of the incident light is to be captured by or confined within the light absorption region 210 so as to reach the aforementioned photonic lock condition. Assuming no phase change is introduced by the first and second mirrors for purposes of discussion herein, when the light resonates in the light absorption region 210, the one-circulation phase change θ is equal to 2 mπ (where m is integer), and therefore, by combining equation (2) and equation (3) into the S-matrix in equation (1), the following equation results:

$$\frac{B1}{A1} = \frac{(\sqrt{\alpha} - \sqrt{R1})^2}{(1 - \sqrt{\alpha}\sqrt{R1})^2} \quad \text{Eq. (5)}$$

It can be seen from equation (5) that, if R1=α, then B1=0. Consequently, to reach a photonic lock condition as described here, an amount of energy of light escaped from the first reflective region (e.g., B1), after the light being reflected by the second reflective region, should be substantially zero, meaning that a substantial amount of energy of the incident light is captured by or confined within the light absorption region 210. Accordingly, one or more examples of the first mirror 220 is configured to exhibit a reflectivity R1 that substantially equals a one-circulation attenuation coefficient of the light absorption region α.

With the above steady-state description in mind, the following describes a transient-state example to further illustrate the physical principles behind the photonic lock photodetectors. Assuming R1 is 10%, if the one-circulation attenuation coefficient α is designed to be 10% as well, then photodetector 200 can reach the aforementioned photonic lock condition "α=R1" when it operates. Consider the following scenario, after an incident light passes through the first mirror 220 and becomes 90%, it travels through the light absorption region 210 while being absorbed by the region 210, gets reflected from the second mirror 230, and makes another pass through the region 210. Since a is designed to be 10%, before this light exits the region 210 and meets the first mirror 220 again, the one-circulation optical intensity of the light becomes 90%×10%=9%. Because the first mirror 220 is a reciprocal structure, when this light encounters the first mirror 220, 0.9% (which is 9%×10%) of the light may appear to be reflected back into the region 210 and 8.1% of the light may appear to pass through the first mirror 220 without being absorbed by the cavity.

However, despite the amount of energy the light appears to leak or escape from the first mirror 220 being 10% (e.g., after "zero pass") and 8.1% (e.g., after "first pass"), it is observed here that these lights escape at different phases. More specifically, these escaped lights create destructive interferences to each other, and therefore the energy that actually leaks outside the light absorption region 210 can be smaller than what it appears in the above calculations (e.g., the sum of 10% and 8.1%).

According to the technique disclosed here, when the optical parameters of the first mirror 220, the light absorption region 210, and the second mirror 230 are configured together such that the photodetector 200 can reach the photonic lock condition (i.e., "α=R1") when it operates, after numerous light passes, essentially all the light that leaks out cancels each other because of destructive interference, meaning that almost all the power of the original incident light A1 is trapped inside and absorbed by the light absorption region 210.

Note that, although many non-ideal factors such as process condition and variation may exist, the technique introduced here can still bring similar benefits even when there is a slight deviation from the ideal "α=R1" case, only that the confinement efficiency may be lower.

Figure 3:
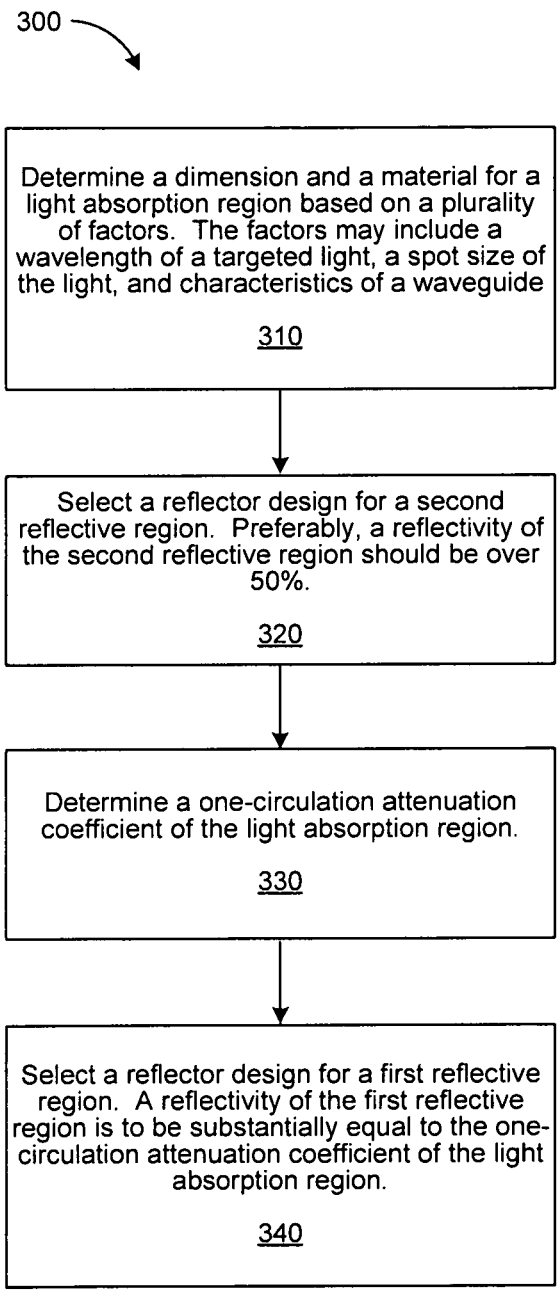
FIG. 3 illustrates a flow diagram showing an example of a design process that may be implemented by an electronic design automation (EDA) software application for designing a photonic lock based photodetector.

FIG. 3 illustrates a flow diagram showing an example of a design process 300 that may be implemented by an electronic design automation (EDA) software application for designing a photonic lock based photodetector (e.g., the photodetector 200). Note that, while methods introduced here include a number of steps or operations that are described and/or depicted as performed in a specific order, these methods may include more or fewer steps, which may be performed in serial or in parallel. Also, an order of two or more steps may be changed, performance of two or more steps may overlap, and two or more steps may be combined into a single step.

First, a dimension and a material for a light absorption region can be determined (310) based on a plurality of design factors. The design factors include a target light's wavelength, its spot size, and characteristics of the waveguide or coupling device (e.g., the optical fiber on top, or the waveguide coupled to the first mirror).

Then, a reflector design for the second mirror can be selected (320). The second mirror is to reflect a majority of the light back into the light absorption region. In one or more examples, the second mirror is designed to have as high reflectivity as allowable (i.e., as close to 100% as possible) by the fabrication process. Some examples of the second mirror can include a distributed Bragg reflector (DBR) mirror, a tapered DBR mirror, a loop mirror, a corner mirror, a metal mirror, a silicon-oxide mirror, a silicon-nitride mirror, or a suitable combination of the above. According to certain examples, the second mirror's reflectivity is higher than 50%. Note that the material composition of the second mirror can also include light absorption materials to absorb evanescent optical field extended from the cavity that penetrates into the second mirror.

Next, a one-circulation attenuation coefficient (a) of the light absorption region can be determined (330) based on the results of steps 310 and 320. The one-circulation attenuation coefficient represents how much light (in terms of its optical intensity) remains in the light absorption region when the light travels from entering the light absorption region to exiting the light absorption region, having been reflected by the second reflective region and assuming the exiting point is on the same end of the light absorption region as the entry point.

Thereafter, a reflector design for a first mirror can be selected (340). As discussed above, a reflectivity of the first mirror is configured to be substantially equal to the one-circulation attenuation coefficient (α) of the light absorption region. Similar to the second mirror, designs the first mirror can include a DBR mirror, a tapered DBR mirror, a loop mirror, a corner mirror, a metal mirror, a silicon-oxide mirror, a silicon-nitride mirror, or a suitable combination of the above. According to certain examples, the first mirror's reflectivity is lower than 50% or lower than the reflectivity of the second mirror. Note that the material composition of the first mirror can also include light absorption materials to absorb evanescent optical field extended from the cavity that penetrates into the first mirror. It is also noted that, because the light can be trapped inside the light absorption cavity, the length or the thickness of the light absorption cavity itself can become relatively short as compared to traditional photodetectors. Further, note that an anti-reflection coating layer which is typically required for conventional photodetectors may no longer be required in the photonic lock based design. In one example, the length of the light absorption region is shorter than 1 μm. In other examples, the length can be reduced to hundred-nanometer range and still enjoy high responsivity at high bandwidth.

Although not depicted in FIG. 3, a designer (or the EDA software application) may run simulations to verify and, if necessary, repeat the above steps to adjust or optimize various design parameters in order to better suit the application's need.

Also, note that the exact dimensions of various components in a photonic lock based photodetector (e.g., the length, width, and thickness thereof) should be so adapted that they match or at least as be as close as possible to the aforementioned photonic lock condition. Such condition depends on various factors including the spot size of the incident light, the mode of the light, the wavelength of the light, the material of the absorption cavity region, the material and reflectivity of the mirrors, and so forth. These choices may affect the confinement efficiency (henceforth the responsivity and bandwidth); however, these design choices are a part of the optimization process, which does not change the aforementioned operating principles of the photonic lock. Therefore, a person skilled in this art will be able to apply the technique introduced here in performing design optimization.

Figure 4:
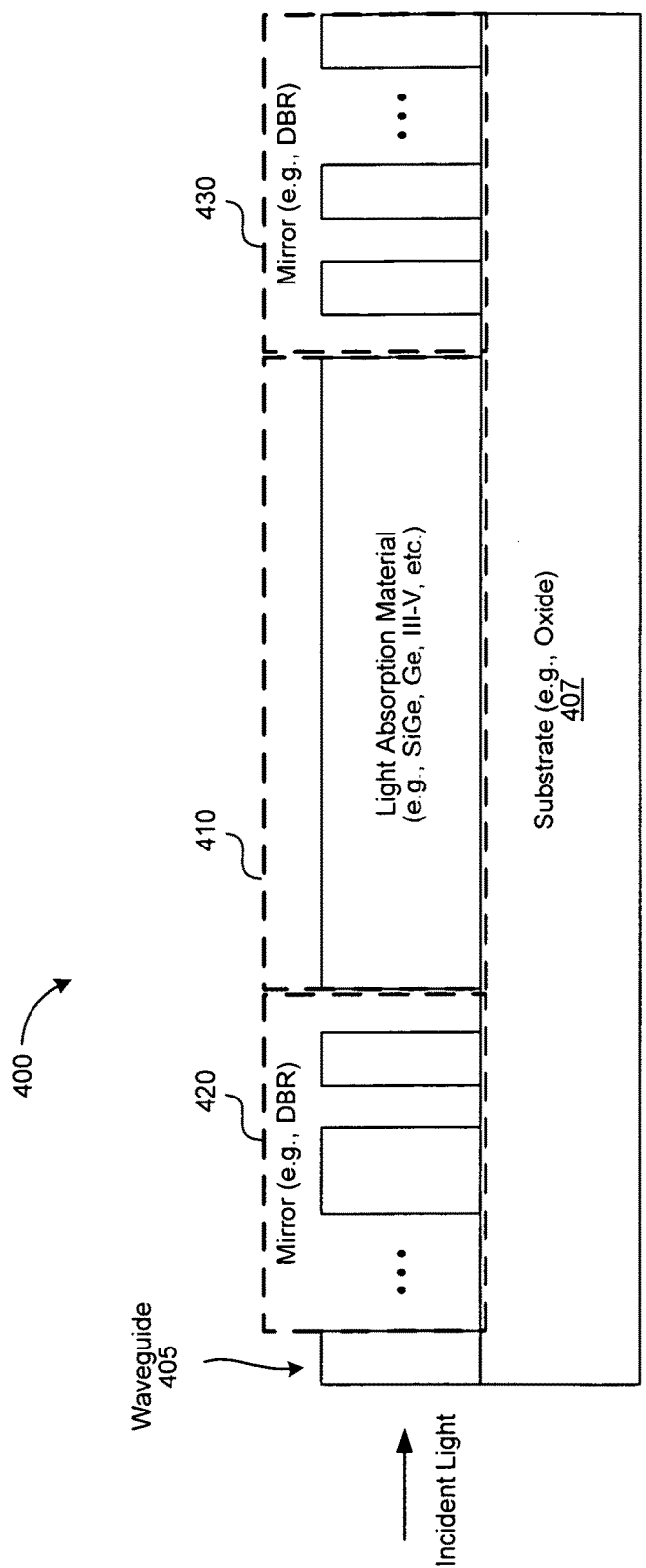
FIG. 4 illustrates a cross-sectional view of an example implementation of a butt-coupling photodetector incorporating the technique introduced here.

FIG. 4 illustrates a cross-sectional view of an example implementation of a butt-coupling photodetector 400 incorporating the technique introduced here. The photodetector 400 includes a substrate 407, a waveguide 405, a first mirror region (or reflective region) 420, a light absorption region 410, and a second mirror region 430. With reference to the components shown in FIG. 4, a method for forming the photodetector 400 is introduced.

Firstly provided is the substrate 407, which can be silicon dioxide ($SiO_2$) or other suitable oxide. In variations, the substrate 407 may comprise other materials, for example, gallium arsenide (GaAs), indium phosphide (InP), glass, polymer, or oxynitride.

As shown in FIG. 4, the waveguide 405 is formed over the substrate 407. The waveguide 405 is configured to receive an incident light (e.g., which may be an optical signal from an optical fiber, not shown in FIG. 4) and to pass the incident light through the first reflective region 420 into the light absorption region 410. In one example, the waveguide 405's material comprises silicon (Si). Additionally or alternatively, other suitable materials can be used, for example, indium gallium arsenide (InGaAs), doped glass, polymer, or nitride. In some examples, the waveguide 405 is a single-mode or multi-mode silicon waveguide. Note that, in general, the waveguide material needs to exhibit a smaller absorption rate than that of the absorption layer itself at the intended operational wavelength. In some examples, the material of the waveguide layer has a larger band gap as compared to that of the absorption layer.

The first reflective region 420 and the second reflective region 430 can be formed over the substrate 407. As shown, the first reflective region 420 and the second reflective region 430 can be formed on the same planar surface. In some examples where the first and second reflective regions 420 and 430 are made of the same material as the waveguide 405, all three structures can be formed (e.g., on or over the substrate 407) using the same step or steps.

Next, the light absorption region 410 is formed between the first and second reflective regions 420 and 430. For example, a light absorption material, such as silicon, germanium, silicon-germanium, organic material, or other Group III-V materials, can be disposed or chemically deposited on substantially the same planar surface as the first and second reflective regions 420 and 430 (e.g., over the substrate 407). The light absorption region 410 is positioned such that it can absorb light that passes through the first reflective region 420 and reflects between the first reflective region 420 and the second reflective region 430. In the butt-coupling example of FIG. 4, the light absorption material is formed on substantially the same planar surface as the first and second reflective regions 420 and 430. This can be implemented by one or more known etching and chemical deposition processes. Note that the light absorption region 410 can also be formed prior to the formation of the first and second reflective regions 420 and 430.

Figure 5:
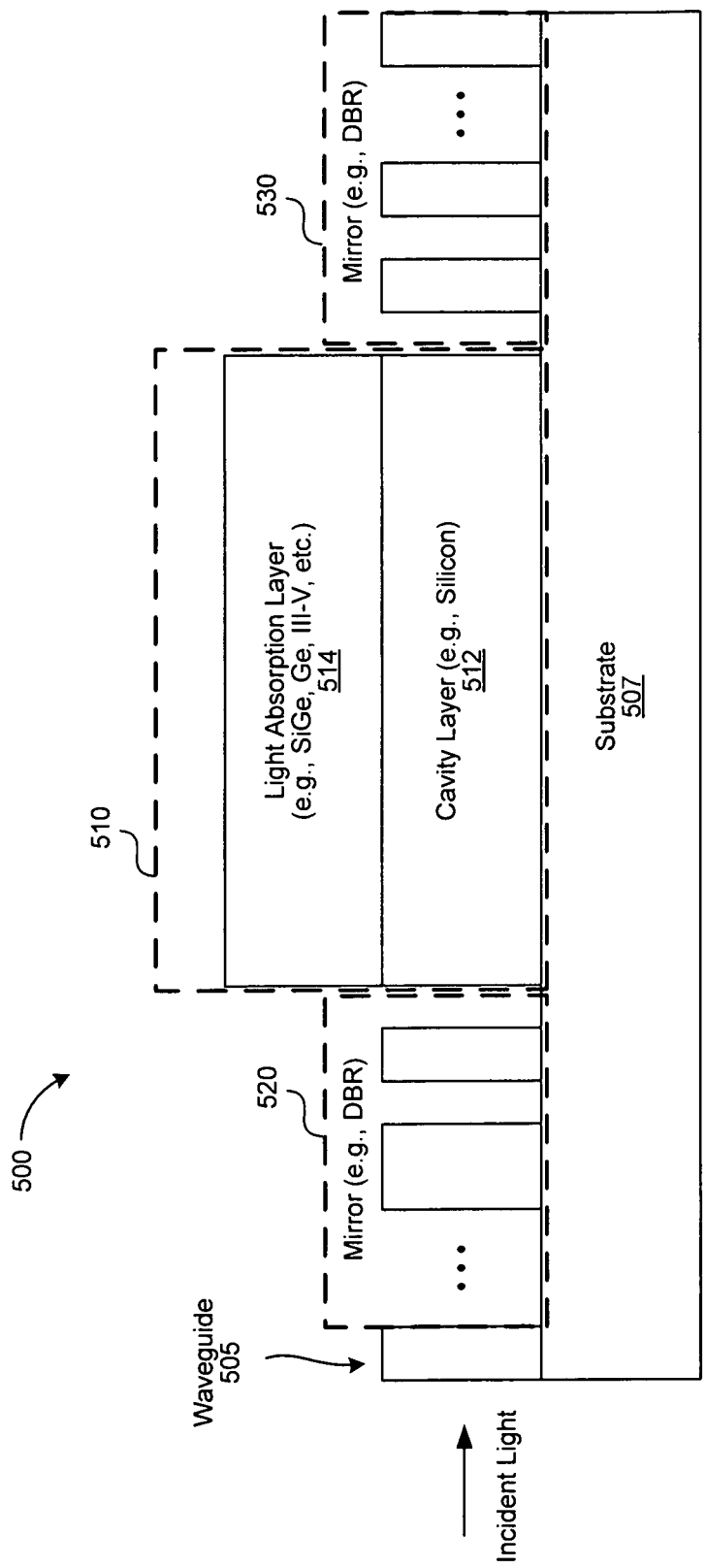
FIG. 5 illustrates a cross-sectional view of an example implementation of an evanescent-coupling photodetector incorporating the technique introduced here.

As mentioned above, the first reflective region 420 is configured to exhibit a reflectivity that causes an amount of energy of light escaped from the first reflective region, after being reflected by the second reflective region, to be substantially zero. In one or more examples, the first reflective region 420's reflectivity is configured to be substantially equal to a one-circulation attenuation coefficient of the light absorption region 410. FIG. 5 illustrates a cross-sectional view of an example implementation of an evanescent-coupling photodetector 500 incorporating the technique introduced. Similar to the photodetector 400, the photodetector 500 includes a substrate 507, a waveguide 505, a first reflective region 520, a light absorption region 510, and a second reflective region 530. The structures and manufacturing processes for the waveguide, the substrate, and the first and second reflective regions of the photodetector 500 are similar to those of the photodetector 400 introduced above.

For the light absorption region 510, one difference between the evanescent-coupling photodetector 500 and the butt-coupling photodetector 400 is that a cavity layer 512 (which is not necessarily a light absorption material) is first disposed on substantially the same planar surface as the first and second reflective regions 520 and 530. This can be formed during the step of forming the first and the second reflective regions 520 and 530. In some examples, the cavity layer 512 includes the same material as the first and second reflective regions 520 and 530 for easier fabrication.

Then, optionally, one or more interfacial layers (e.g., a buffer layer for better evanescent coupling or some material stacks for better crystal lattice constant matching) can be disposed over the cavity layer 512 to improve optical characteristics of the interface between the cavity layer 512 and a light absorption layer 514

Thereafter, the light absorption layer 514 which contains the light absorption material can be disposed over the cavity layer 512. It is noted that this process of fabricating the photodetector 500 may be advantageous over the process of fabricating other structures of the photodetector such as 400 in certain implementations where the material of the light absorption layer 514 can be more easily disposed over the cavity layer 512 than over the substrate 507.

Although not depicted in FIG. 5, in another example, the incident light can enter from the top of the absorption layer 514. In accordance with the technique introduced here, the amount of light not absorbed on the first pass can still become confined (or "locked") in the cavity layer 512 while being evanescently absorbed by the absorption layer 514. Also note that the absorption layer 514 can cover a portion of the first and second reflective regions 520 and 530 to further absorb the evanescent optical field extended from the cavity layer 512 that penetrates into the first and second reflective regions 520 and 530.

Figure 6A:
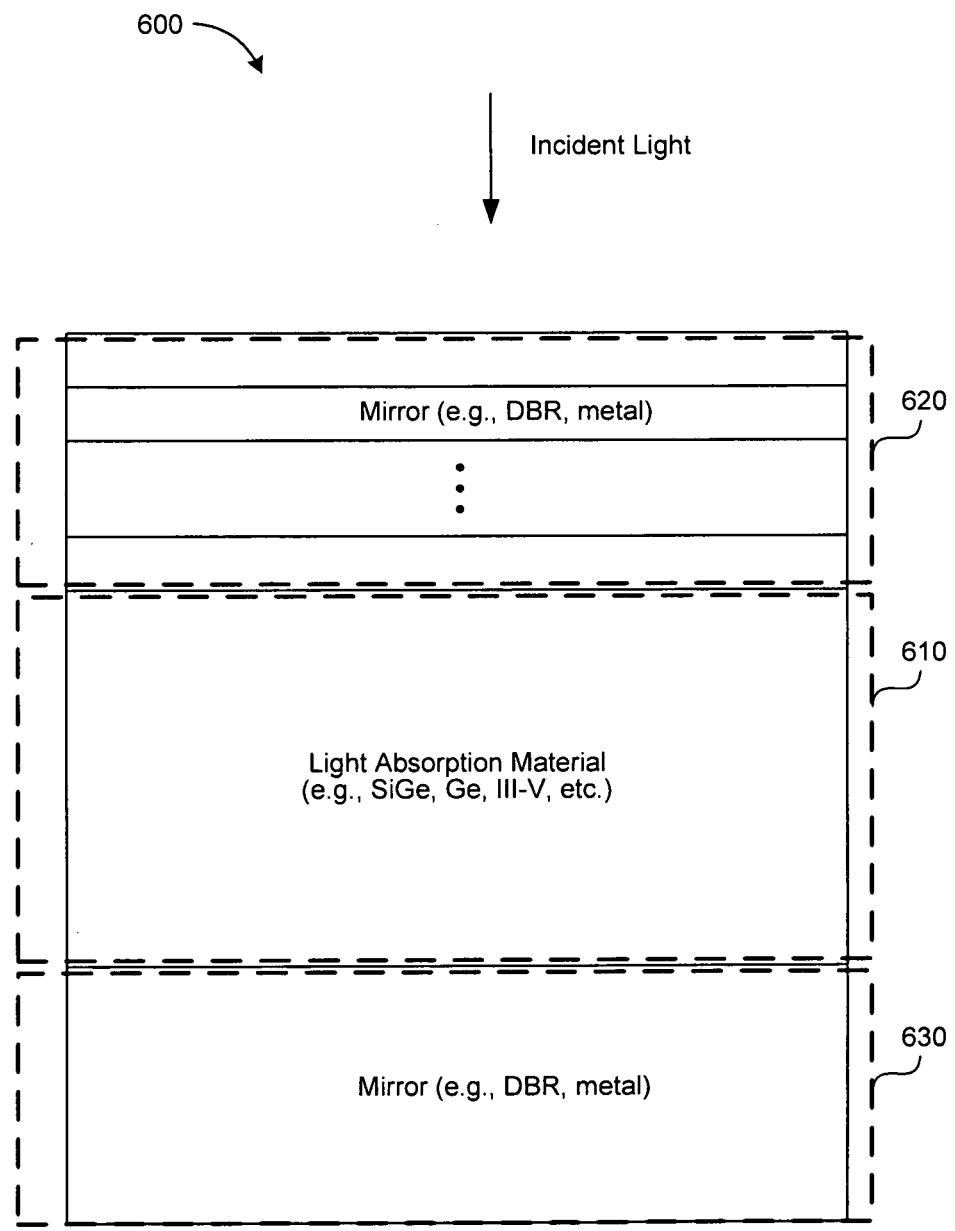
FIGS. 6A-6E illustrate cross-sectional views of exemplary implementations of normal-incidence photodetectors incorporating the technique introduced here.

FIG. 6A illustrates a cross-sectional view of an example implementation of a normal-incidence photodetector 600 incorporating the technique introduced here. Similar to the photodetector 400, the photodetector 600 includes a first reflective region 620, a light absorption region 610, and a second reflective region 630. The structures for the first and second reflective regions of the photodetector 600 are similar to those of the photodetector 400 introduced above. With reference to the components shown in FIG. 6A, a method for forming the photodetector 600 is introduced.

Firstly provided is a substrate, which can be a silicon dioxide ($SiO_2$) or other suitable oxide. In variations, the substrate may comprise other materials, for example, gallium arsenide (GaAs) or indium phosphide (InP). Note that, in certain examples, after the reflective and absorption structures are formed, the substrate can be removed by an etching process, hence not shown in FIG. 6A.

Then, the second reflective region 630 is formed over the substrate. As mentioned above, some examples of the second reflective region 630 can include a DBR mirror, a tapered DBR mirror, a metal mirror, a silicon-oxide mirror, a silicon-nitride mirror, an oxide-metal mirror, a nitride-metal mirror, or a suitable combination of the above. According to certain examples, the second reflective region 630's reflectivity is higher than 50%. In one or more examples, the second reflective region 630 is designed to have as high reflectivity as allowable (i.e., as close to 100% as possible) by the fabrication process.

Next, the light absorption region 610 is formed over the second reflective region 630. For example, a light absorption material, such as silicon, germanium, silicon-germanium, organic material, or other Group III-V materials, can be disposed, bonded, attached, or otherwise chemically deposited over the second reflective region 630.

Thereafter, the first reflective region 620 is formed over the light absorption region 610. As mentioned above, the first reflective region 620 is configured to exhibit a reflectivity that causes an amount of energy of light escaped from the first reflective region 620, after being reflected by the second reflective region 630, to be substantially zero. In one or more examples, the first reflective region 620's reflectivity is configured to be substantially equal to the one-circulation attenuation coefficient of the light absorption region 610. Some examples of the first reflective region 620 can include a DBR mirror, a tapered DBR mirror, a silicon-oxide mirror, a silicon-nitride mirror, an anomalous dispersive mirror containing multiple high/low refractive index pairs, or a suitable combination of the above.

Note that, the above example process is merely one example of forming the normal-incidence photodetector 600. As a variation, the second reflective region 630 can be formed by first removing the portion of substrate beneath the light absorption structure 610, and then coating the etched opening with a reflective material to function as the second reflective region 630 as mentioned in the previous description, and this fabrication process can be performed after the first reflective region is made.

In one variation, the first reflective region 620 can be formed on the substrate, and then the light absorption region 610 is disposed on top of the first reflective region 620, which can be followed by disposing the second reflective region 630 on top of the light absorption region 610, thereby forming the structure 600 as shown in FIG. 6A. Then the substrate can be used as an integrated lens or be removed to expose the first reflective region for the incident light.

In another variation, the first reflective region 620 can be formed by first removing the substrate portion beneath the light absorption region 610, and then coating the etched opening with one or more reflective materials so as to function as the first reflective region 620. In some examples, this etching and coating fabrication processes can be performed after the second reflective region 630 is fabricated.

Subsequently, an optical coupling apparatus (not shown in FIG. 6A) can be coupled to the first reflective region 620. It is configured to receive an incident light (e.g., which may be an optical signal from an optical fiber, not shown in FIG. 6A) and to pass the incident light through the first reflective region 620 into the light absorption region 610.

Figure 6B:
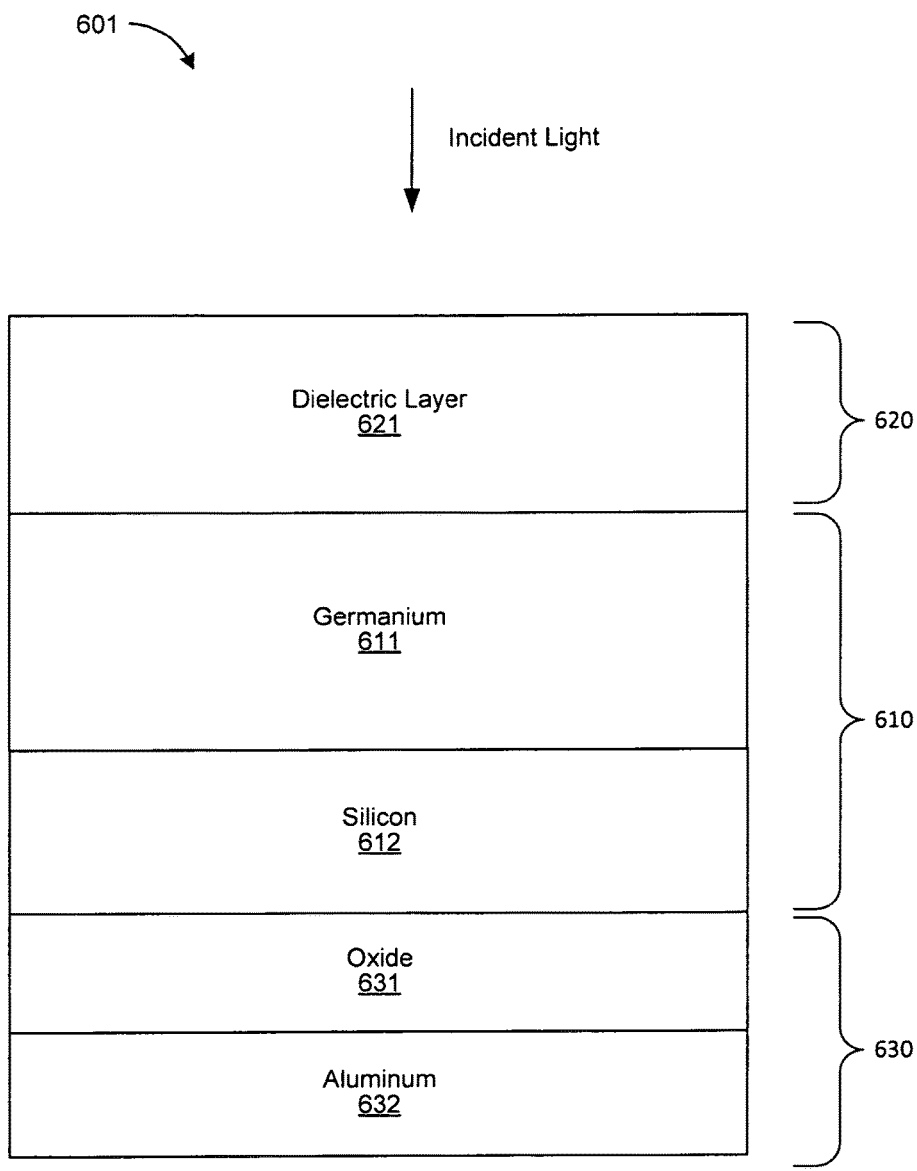

A specific example of a normal incidence photodetector 601 incorporating the technique introduced here is shown in FIG. 6B, where light is incident from the top of the wafer through the dielectric layer 621. The dielectric layer 621, which functions as the first reflector, can be implemented as a single oxide layer with thickness adjusted to the desired reflectivity. Note that in other examples, the dielectric layer 621 can be implemented as multiple layers forming high/low refractive-index pairs to function as an anomalous dispersion mirror. Generally speaking, the anomalous dispersion mirror design can be advantageous for compensating the wavelength dispersion inside the cavity and obtain larger operation wavelength window.

After the light passes through the dielectric layer 621, it enters a cavity region containing a germanium layer 611 to absorb light. The thickness of the germanium layer 611 is selected to obtain the desired absorption rate, which is related to the one-circulation attenuation coefficient as mentioned before. In some implementations, such as the photodetector 601, the cavity region can further contain a silicon layer 612, which functions as a buffer layer with its thickness adapted based on a wavelength of incident light for a select bandwidth. The total thickness of this cavity region (i.e., layers 621 and 622 in FIG. 6B) can also be used to adjust the phase of the light in order to reach the photonic lock condition introduced here. For example, the thickness of the germanium layer 611 can be ranging from 100 nm to 1.5 um, and the thickness of the silicon layer 612 from 0 to 1.5 um. Also, the silicon layer 612 can be partially doped.

As illustrated in FIG. 6B, the second reflector of the photodetector 601 is formed by an oxide layer 631 in addition to an aluminum layer 632. The oxide layer 631's thickness is adjusted to a desired reflectivity and phase shift to further increase the total reflectivity of the second reflector, as compared to a single aluminum layer 632. Note that, similar to the dielectric layer 621, the oxide layer 631's reflectivity also changes periodically with its thickness, and again the period is different for different light wavelength. The aluminum layer 632 here functions as the main reflecting material, with its reflectivity fine-tuned based on the thickness of the oxide layer 631. For example, if the aluminum layer 632 is to be in direct contact with the silicon layer 612, the aluminum layer 632's reflectivity typically is around 90%; however, the total effective reflectivity of the second reflector can be increased to approximately 99% with the addition of the oxide layer 631 and if the thickness of the oxide layer 631 is adjusted properly. In some examples, the thickness of the oxide layer 631 is from 0 nm to 5 um.

Figure 6C:
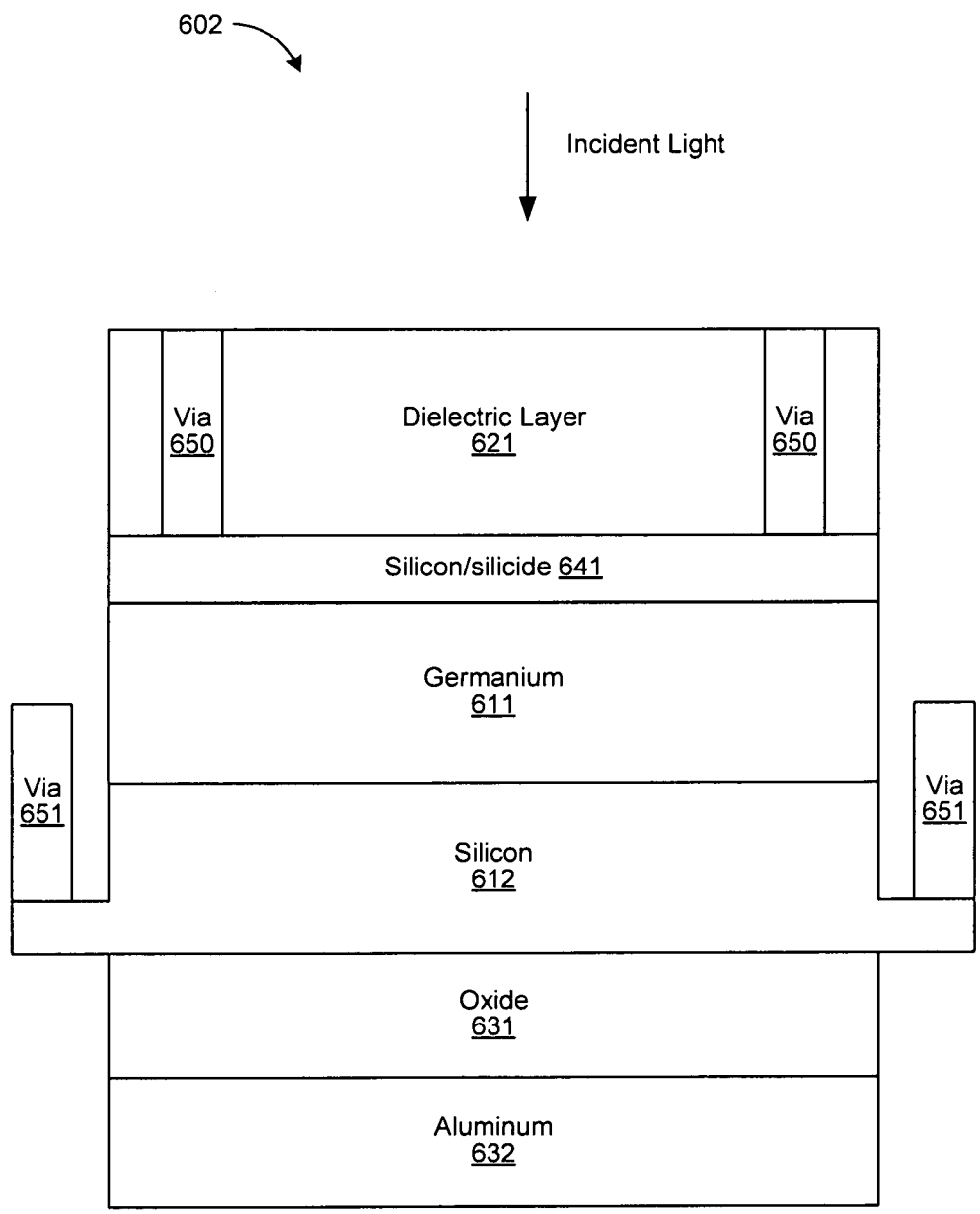

FIG. 6C shows a photodetector 602, which is one example of the photodetector 601 illustrated with more detailed implementation. In FIG. 6C, contacts are shown that can provide electrical field inside the cavity region. In the photodetector 602, vias 650 are further included on top of a silicon layer 641. The contact regions between each of the vias 650 and the silicon layer 641 can include silicide for better electrical conductivity. The vias 650 can be formed by first using a thin liner layer to create suitable trenches and then filling the trenches with metal. Similarly, vias 651 can be formed on top of the silicon layer 612, with the contact regions also having silicide. In some implementations, the voltage level applied to the vias 650 is less than the voltage level applied to the vias 651, where the vias 650 form a P-type contact and the vias 651 form an N-type contact.

Figure 6D:
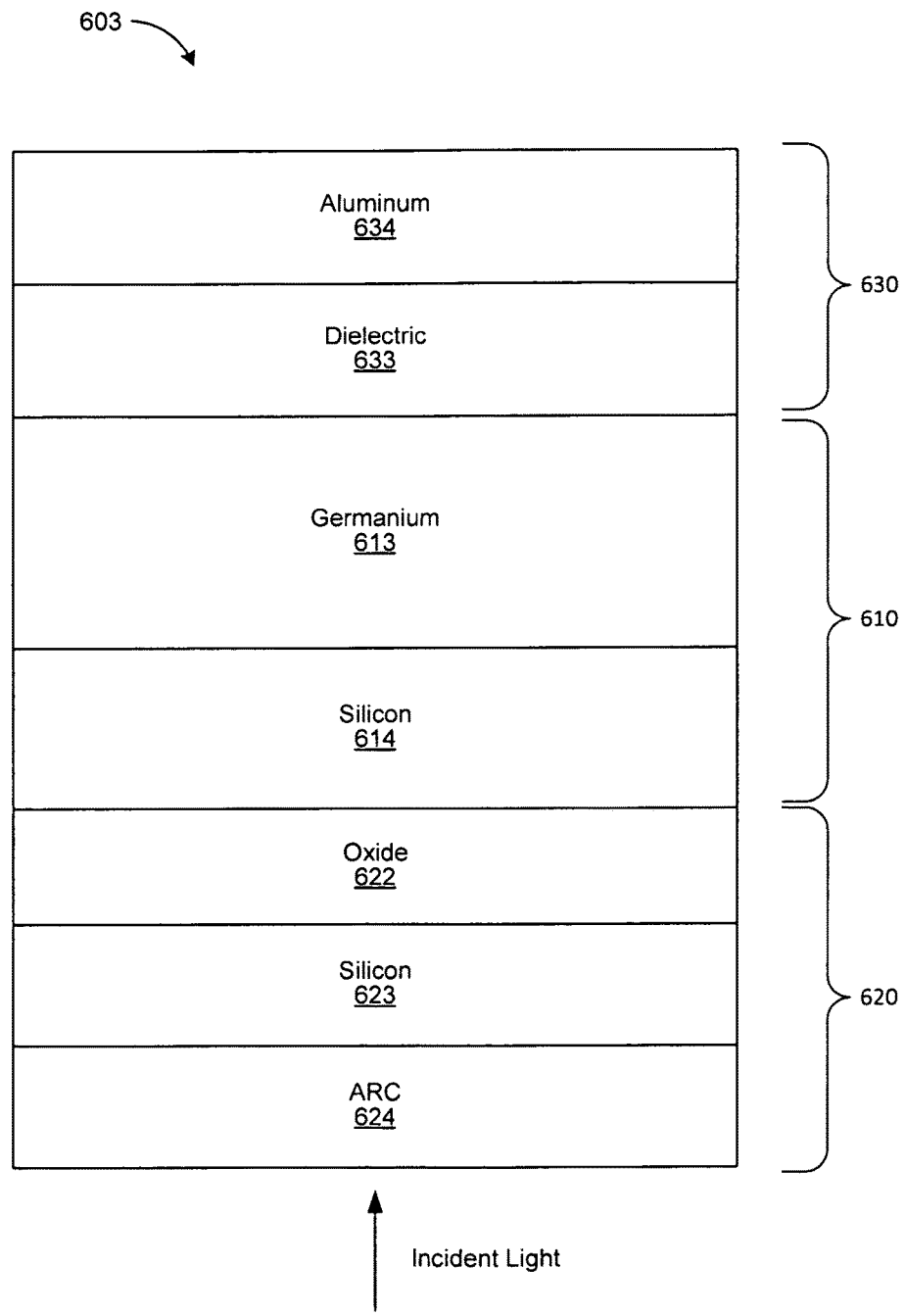

Shown in FIG. 6D is a photodetector 603, which is an exemplary implementation of a normal incidence photodetector where light is incident from the bottom of the wafer through an oxide layer 622 and a silicon substrate layer 623. In this example, the substrate is not entirely removed by etching or polish processes. The oxide layer 622 for example can be implemented as a buried oxide layer, which is formed as a part of the initial silicon on insulator (SOI) wafer, with the layer 622's thickness adjusted to the desired reflectivity. For example, the oxide layer 622 can be thicker than 100 nm. As above mentioned, the reflectivity of the layer changes periodically with the thickness. The oxide layer 622 can also be implemented as multiple layers forming high/low refractive-index pairs to function as an anomalous dispersion mirror. The silicon layer 623 is an optional layer, and if included, the silicon layer 623 can be used to function as an integrated lens to collimate or focus the incident light before the light enters the oxide layer 622. This silicon layer 623 can be a part of the original SOI wafer substrate, or it can be added after the thickness of the oxide layer 622 is set. In some examples, the total thickness of the oxide layer 622 and the silicon layer 623 can be less than 300 nm. Further, in some implementations, an anti-reflection coating (ARC) layer 624, such as a nitride layer, can be disposed over the silicon substrate layer 623.

The cavity region of the photodetector 603 contains a germanium layer 613 to absorb light, with the germanium layer 613's thickness adapted to obtain the desired absorption rate. The absorption rate is related to the one-circulation attenuation coefficient, as mentioned before. The total thickness of this cavity region can also be used to adjust the phase of the light to reach the photonic lock condition. In one or more implementations, the thickness of the germanium layer 613 can be from 100 nm to 1.5 um, and the thickness of the silicon layer 614 can be from 0 to 1.5 um. The silicon layer 614 can be partially doped.

In addition to an aluminum layer 634, the second reflector of the photodetector 603 is formed with a dielectric layer 633 with the dielectric layer 633's thickness adapted to the desired reflectivity and phase shift in order to further increase the total reflectivity of the second reflector (as compared to a single aluminum layer 634). The change of reflectivity and phase shift is also a periodic function of thickness, and the period is different for different light wavelength. The dielectric layer 633 for example can be a single oxide layer with thickness adjusted to the desired reflectivity (reflectivity changes periodically with the thickness) or it can be a combination of oxide and nitride layers, where the nitride layer can be used as an etching or polishing stopping layer. The aluminum layer 634 is the main reflecting material with its reflectivity fine-tuned based on the thickness of the dielectric layer 633. For example, if the aluminum layer 634 is to be in direct contact with the germanium layer 613, the aluminum layer 634's reflectivity typical is around or less than 90%; however, with the dielectric layer 633, the total effective reflectivity of the second reflector (including the aluminum layer 634 and the dielectric layer 633) can be increased to approximately 99%, assuming that the thickness of the dielectric layer 633 is adjusted properly. In some examples, the thickness of the dielectric layer 631 can be from 0 nm to 5 um.

Figure 6E:
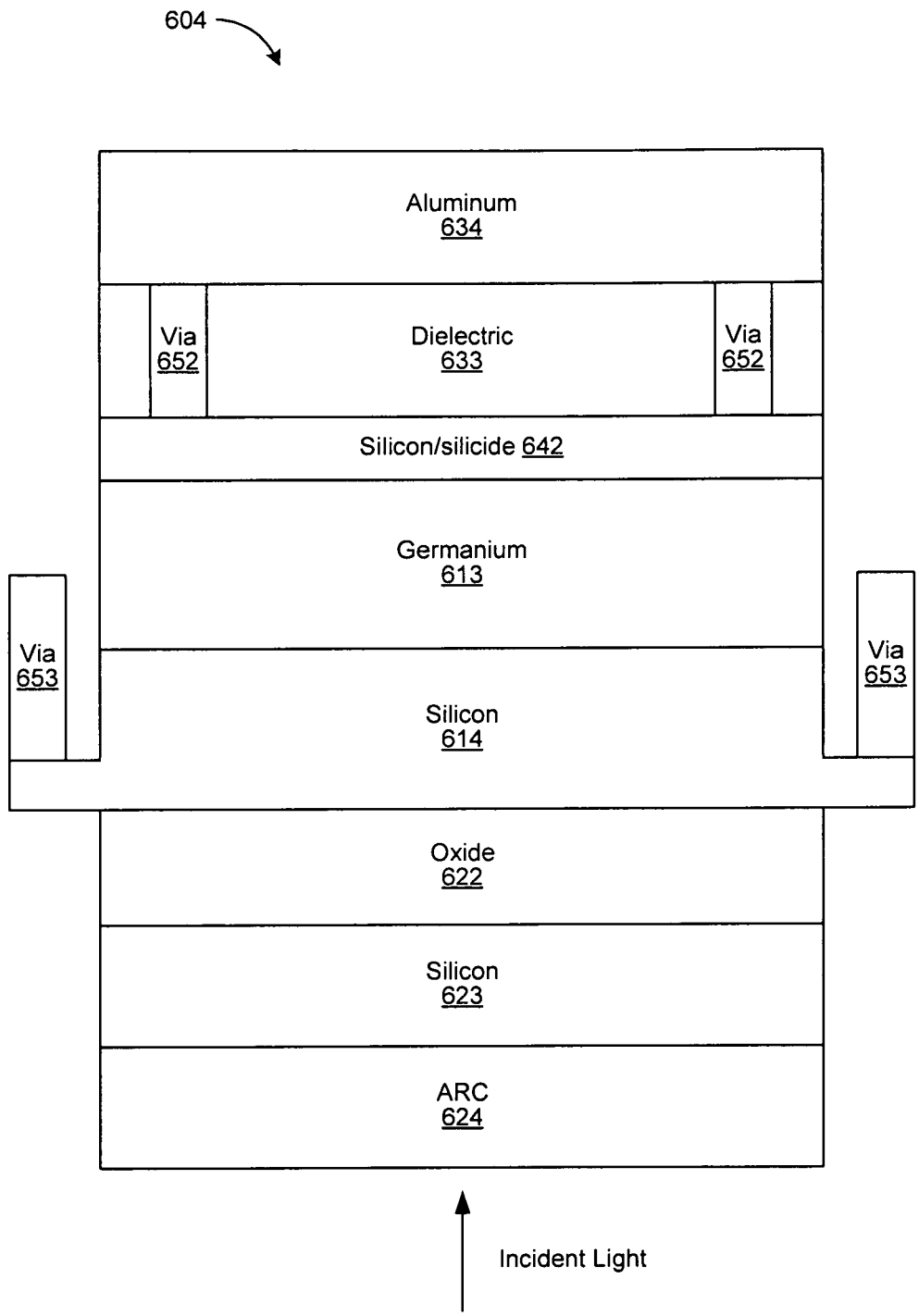

Shown in FIG. 6E is a photodetector 604, which is an application example of photodetector 603. In FIG. 6E, contacts are shown that can provide electrical field inside the cavity region. In the photodetector 604, vias 652 are further included on top of a silicon layer 642. The contact regions between each of the vias 652 and the silicon layer 642 can include silicide for better electrical conductivity. The vias 652 can be formed by first using a thin liner layer to create suitable trenches and then filling the trenches with metal. Similarly, vias 653 can be formed on top of the silicon layer 614, with the contact regions also having silicide. In some implementations, the voltage level applied to the vias 652 is less than that applied to the vias 653, where the vias 652 form a P-type contact and the vias 653 form an N-type contact.

FIGS. 7A-7H illustrate various examples of mirror designs, which can be adapted in the photonic lock based photodetectors introduced here. For simplicity, only examples of butt-coupling photodetectors are shown in FIGS. 7A-7H; however, similar techniques can be applied to different type of photodetectors. In addition, although the first and the second mirrors in each of FIGS. 7A-7H are illustrated as exemplifying a certain combination of mirror designs, all the mirror designs illustrated here, as well as other well-known mirror designs, can be adapted for implementing any mirror region (or reflective region) described in the present disclosure.

Figure 7A:
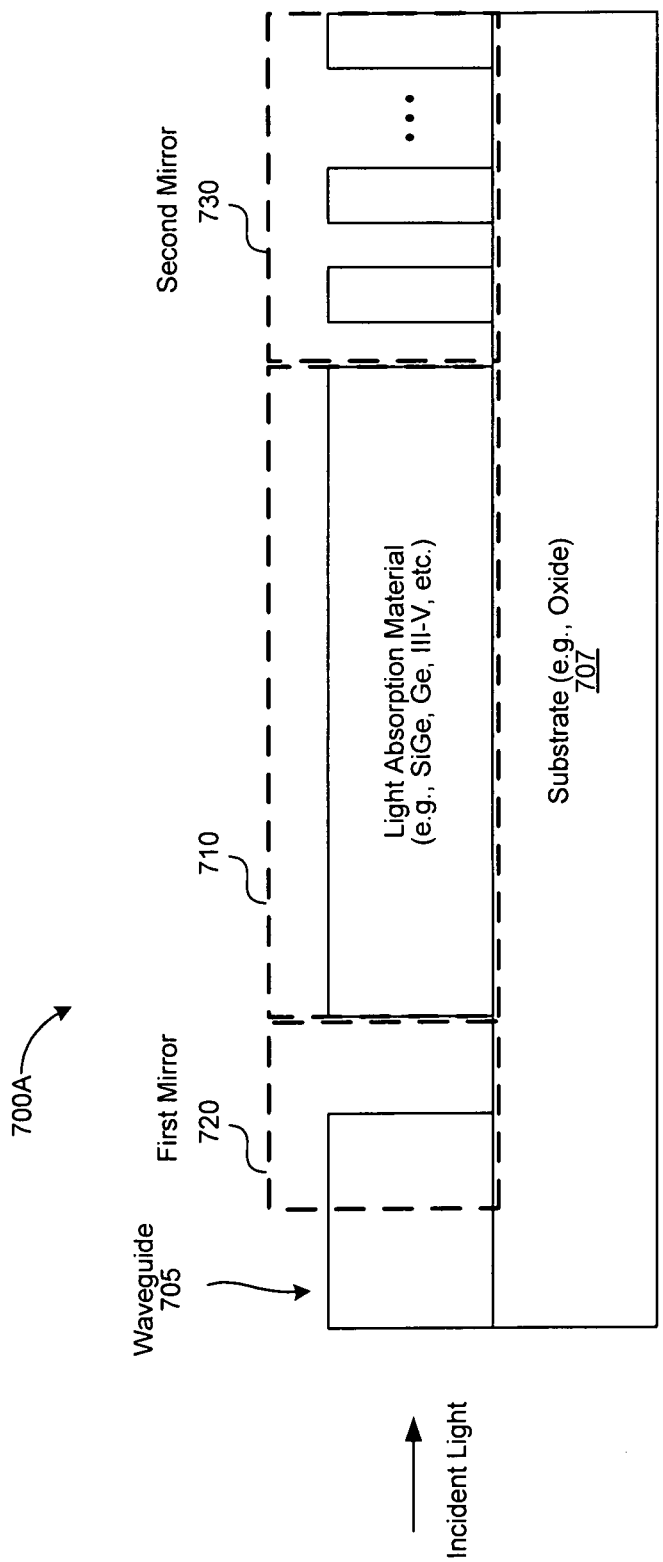
FIGS. 7A-7H illustrate various examples of mirror designs, which can be adapted in the photonic lock based photodetectors.

FIG. 7A illustrates a cross-sectional view of an example implementation of a butt-coupling photodetector 700A. The first mirror 720 can be a high reflection tapered DBR or a low reflection trench, and the second mirror 730 can be a high reflection tapered DBR.

Figure 7B:
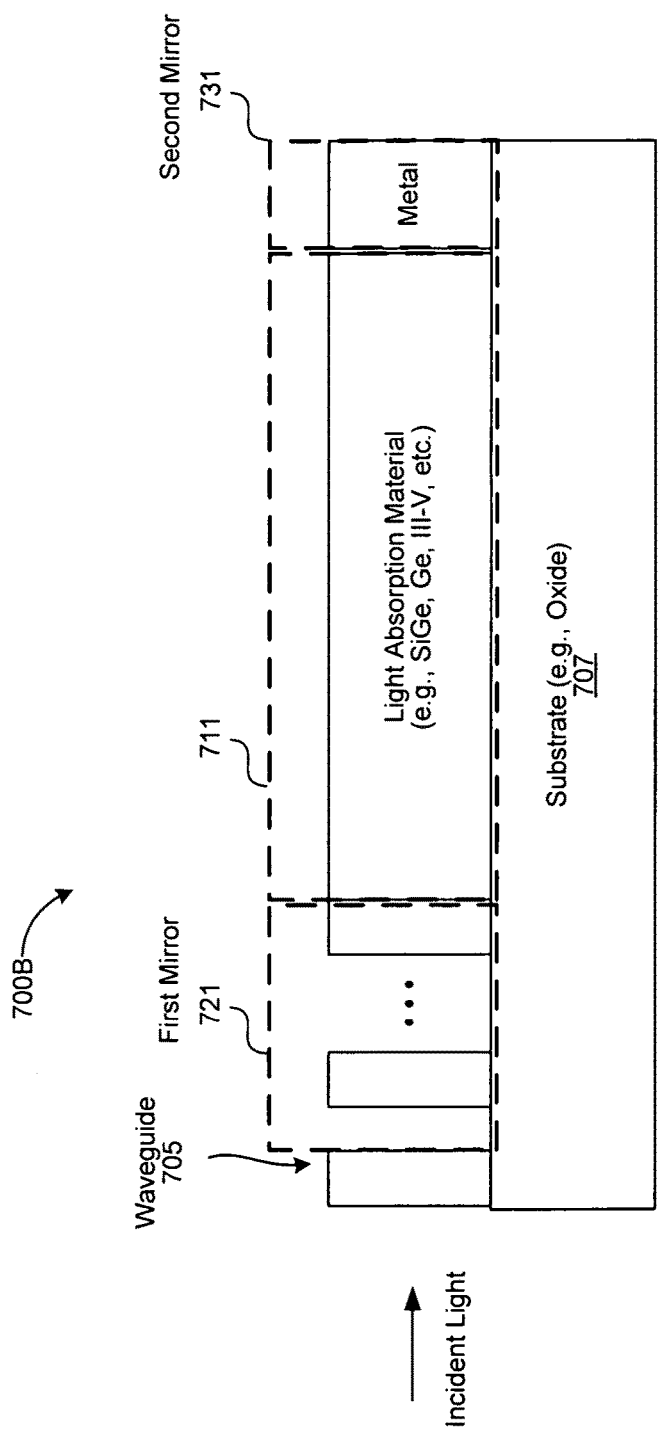

FIG. 7B illustrates a cross-sectional view of an example implementation of a butt-coupling photodetector 700B. The second mirror 731 is implemented via a coating of metal, and the first mirror 721 is implemented using a tapered DBR.

Figure 7C:
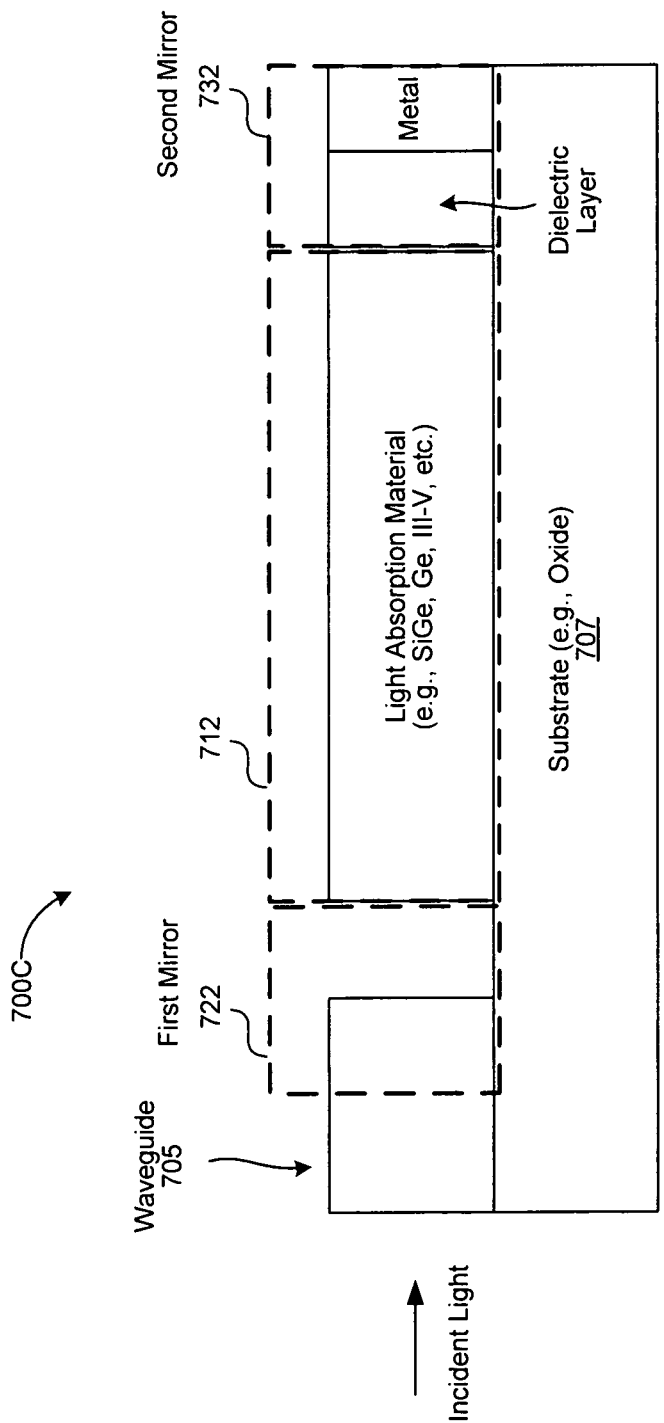

FIG. 7C illustrates a cross-sectional view of an example implementation of a butt-coupling photodetector 700C. The second mirror 732 includes a dielectric layer, for example, a quarter wavelength oxide layer, which may be connected to a coating of metal. The first mirror 722 is implemented using a high reflection tapered DBR or a low reflection trench.

Figure 7D:
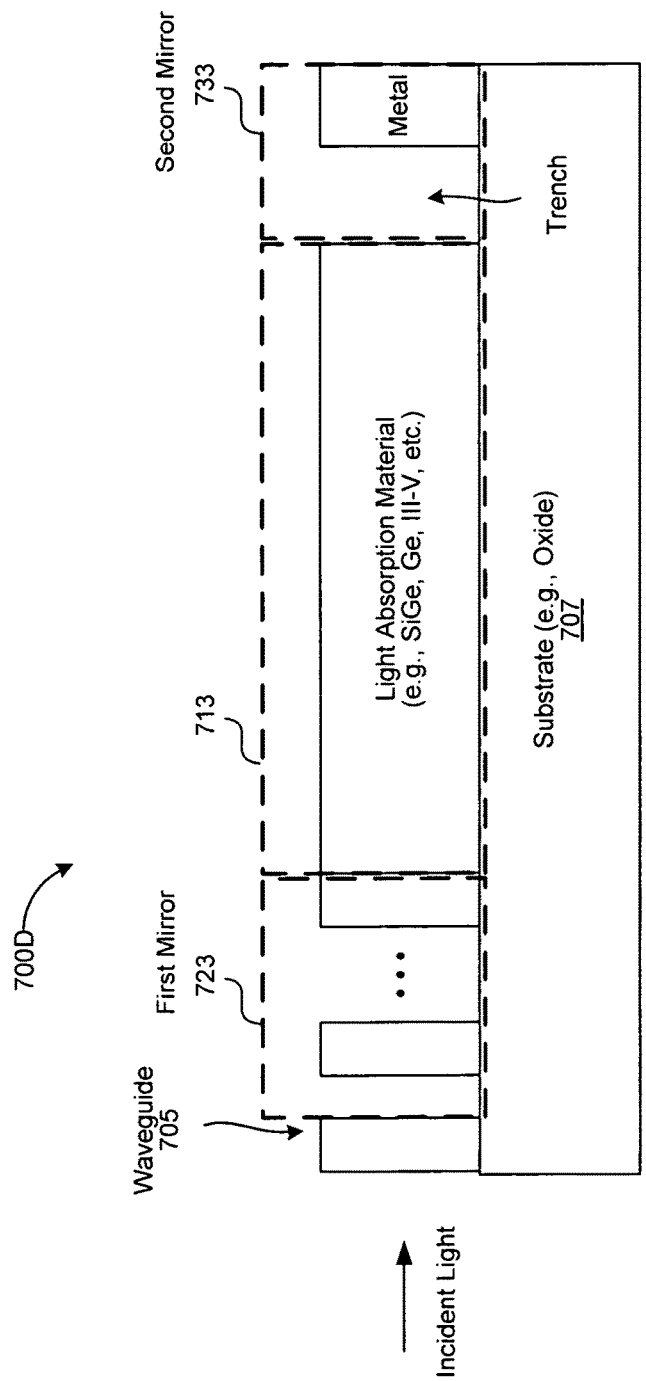

FIG. 7D illustrates a cross-sectional view of an example implementation of a butt-coupling photodetector 700D. The second mirror 733 includes a trench, for example, a quarter wavelength air layer, which may be connected to a coating of metal. The first mirror 723 is implemented using a tapered DBR.

Figure 7E:
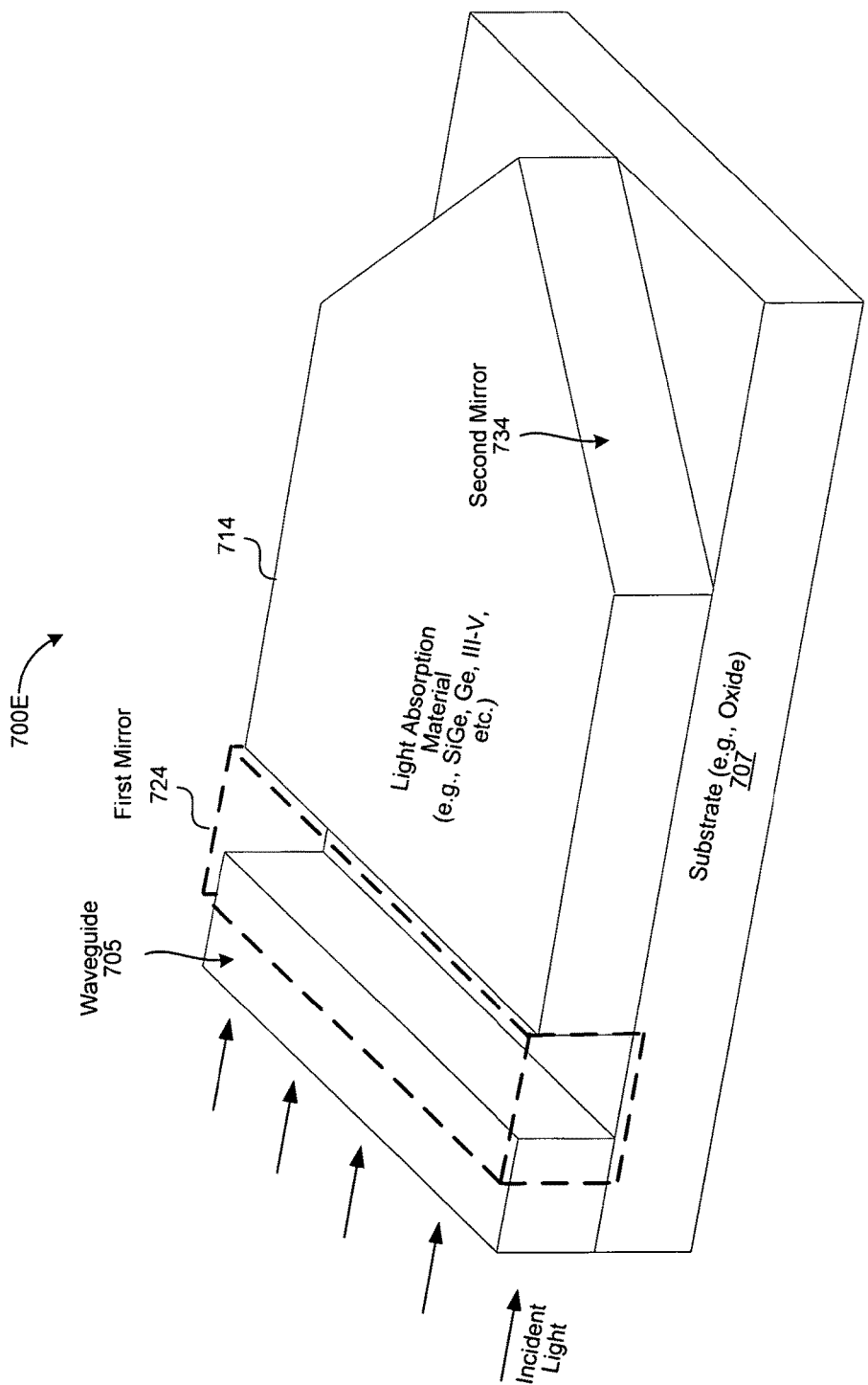

FIG. 7E illustrates a perspective view of an example implementation of a butt-coupling photodetector 700E. The second mirror 734 includes a corner mirror that is made of the same material as the light absorption region 714. As shown in FIG. 7E, the first mirror 724 is implemented using a high reflection tapered DBR or a low reflection trench.

Figure 7F:
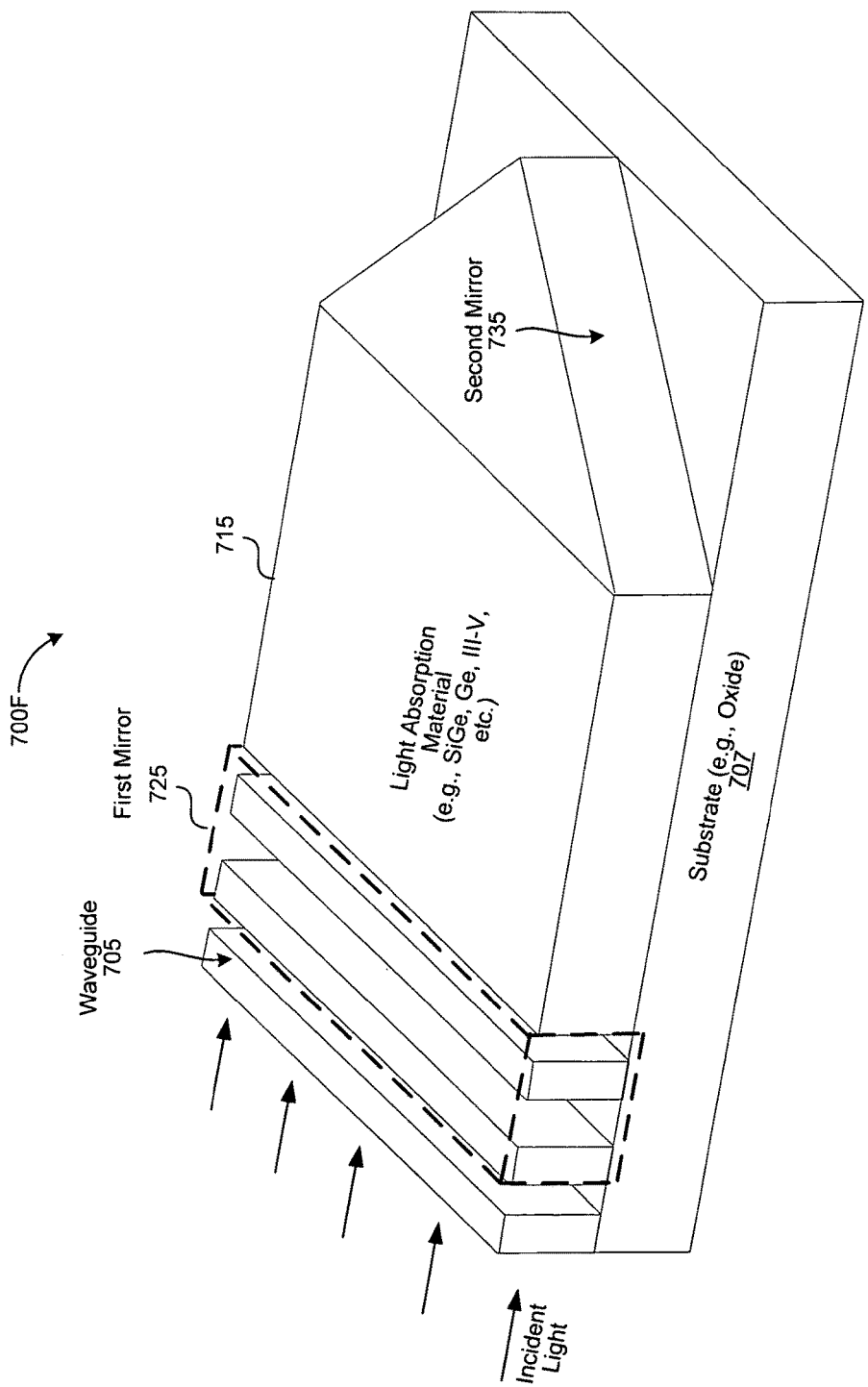

FIG. 7F illustrates a perspective view of an example implementation of a butt-coupling photodetector 700F. The second mirror 735 includes a corner mirror that is made of a different material than the light absorption region 715. As shown in FIG. 7F, the first mirror 725 is implemented using a tapered DBR.

Figure 7G:
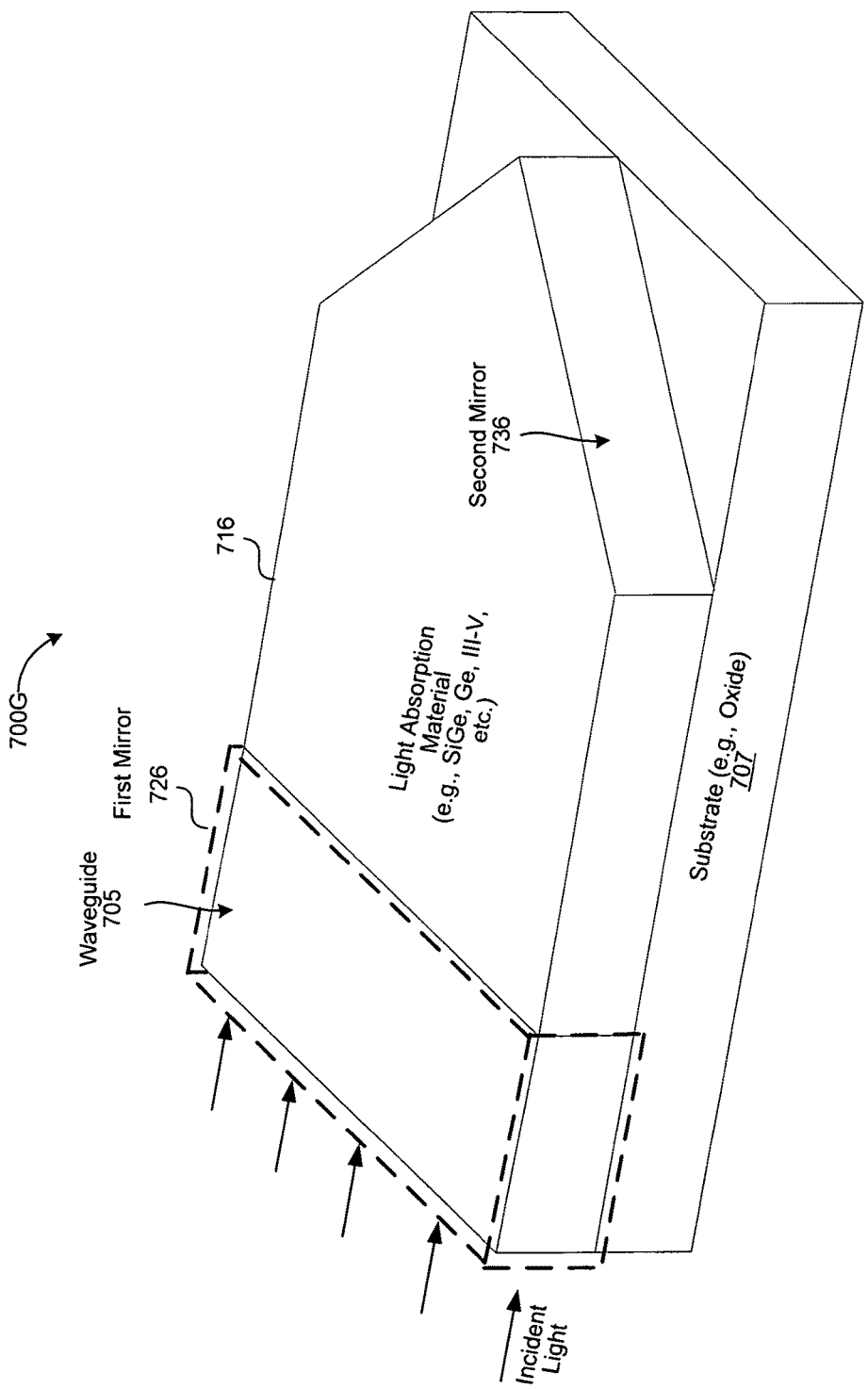

FIG. 7G illustrates a perspective view of an example implementation of a butt-coupling photodetector 700G. As shown in FIG. 7G, the structure of the photodetector 700G is designed such that the interface between the waveguide 705 and the light absorption region 716 essentially functions similarly as the first mirror 726.

Figure 7H:
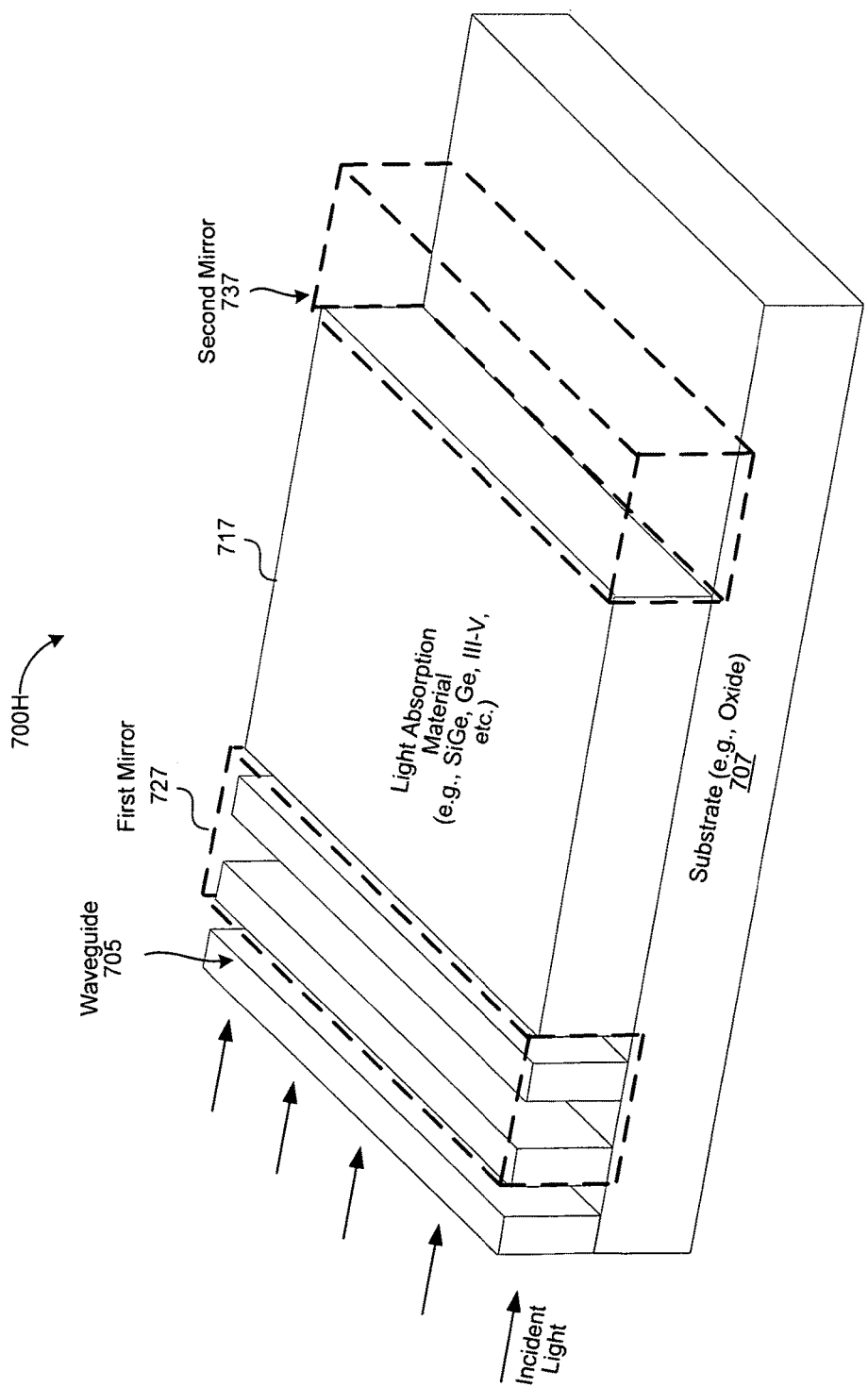

FIG. 7H illustrates a perspective view of an example implementation of a butt-coupling photodetector 700H. As shown in FIG. 7H, the structure of the photodetector 700H is designed such that an end of the light absorption region 717 that is distal from the first mirror 727 essentially functions as the second mirror 737; that is to say, the reflectivity resulting from the difference of materials between the light absorption region 717 and whatever material (which can also be void, such as depicted in FIG. 7H) being disposed at the distal end of the light absorption region 717 (i.e., where the second mirror 737 is depicted) can make the distal end of the light absorption material 717 function as the second mirror 737. As shown in FIG. 7H, the first mirror 727 is implemented using a tapered DBR.

In the above described manner, the technique and apparatus introduced here provide a photonic lock mechanism to confine the incident light inside the light absorption region of the photodetector, thereby achieving both high responsivity and high bandwidth. The technique introduced here also helps shrink the overall size of the photodetectors.

Figure 8:
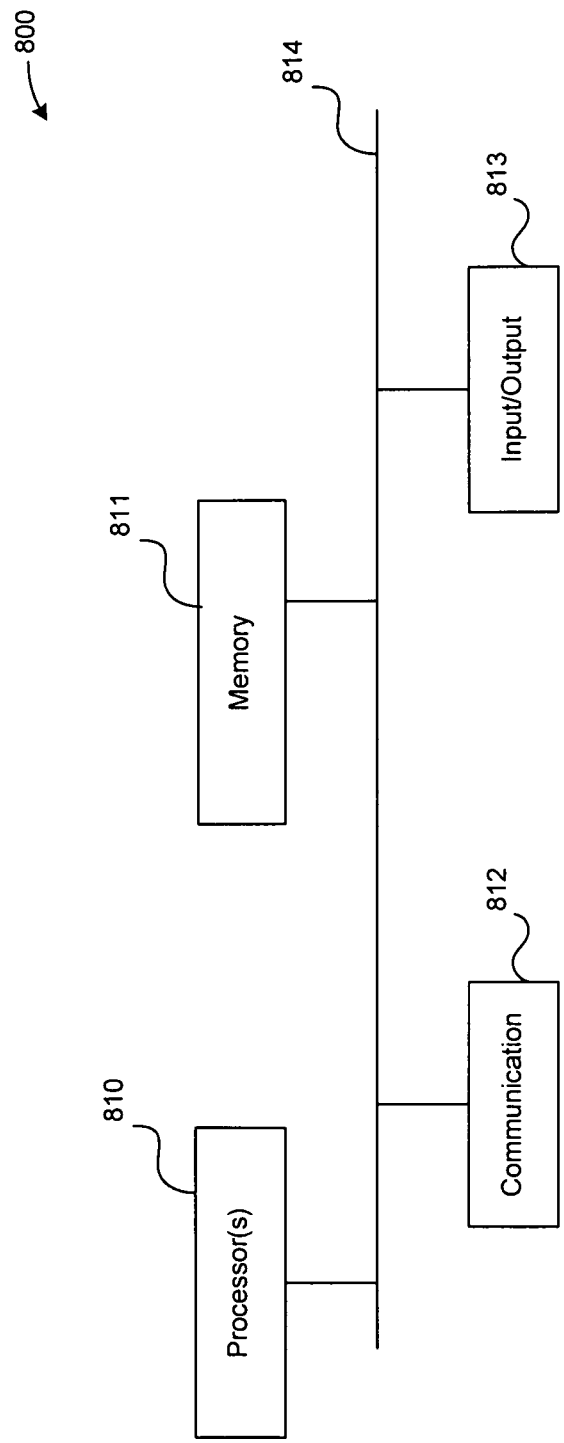
FIG. 8 illustrates a high-level block diagram showing an example of computing system in which at least some portion of the design process of FIG. 3 can be implemented or in which an example of the photonic lock based photodetectors introduced here can be implemented.

FIG. 8 is a high-level block diagram showing an example of a computing device 800 that can implement at least some portion of the design process 300 of FIG. 3. Additionally or alternatively, the computing device 800 can represent an environment within which an example of the photonic lock based photodetectors introduced here can be implemented.

In the illustrated example, the computing system 800 includes one or more processors 810, memory 811, a communication device 812, and one or more input/output (I/O) devices 813, all coupled to each other through an interconnect 814. The interconnect 814 may be or may include one or more conductive traces, buses, point-to-point connections, controllers, adapters and/or other conventional connection devices, such as optical communication elements that may include a photonic lock based photodetector introduced here. The processor(s) 810 may be or may include, for example, one or more general-purpose programmable microprocessors, microcontrollers, application specific integrated circuits (ASICs), programmable gate arrays, or the like, or a combination of such devices. The processor(s) 810 control the overall operation of the computing device 800. Memory 811 may be or may include one or more physical storage devices, which may be in the form of random access memory (RAM), read-only memory (ROM) (which may be erasable and programmable), flash memory, miniature hard disk drive, or other suitable type of storage device, or a combination of such devices. Memory 811 may store data and instructions that configure the processor(s) 810 to execute operations in accordance with the techniques described above. The communication device 812 may be or may include, for example, an Ethernet adapter, cable modem, Wi-Fi adapter, cellular transceiver, Bluetooth transceiver, or the like. The communication device 812 may also include optical communication or optical sensing elements such as a photonic lock based photodetector. Depending on the specific nature and purpose of the processing device 800, the I/O devices 813 can include devices such as a display (which may be a touch screen display), audio speaker, keyboard, mouse or other pointing device, microphone, camera, etc. A photonic lock based photodetector introduced here may be included as (e.g., optical sensing) components in one or more of the I/O devices 813.

Unless contrary to physical possibility, it is envisioned that (i) the methods/steps described above may be performed in any sequence and/or in any combination, and that (ii) the components of respective examples may be combined in any manner.

The techniques introduced above can be implemented by programmable circuitry programmed/configured by software and/or firmware, or entirely by special-purpose circuitry, or by a combination of such forms. Such special-purpose circuitry (if any) can be in the form of, for example, one or more application-specific integrated circuits (ASICs), programmable logic devices (PLDs), field-programmable gate arrays (FPGAs), etc.

Software or firmware to implement the techniques introduced here may be stored on a machine-readable storage medium and may be executed by one or more general-purpose or special-purpose programmable microprocessors. A "machine-readable medium", as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible medium can include recordable/non-recordable media (e.g., read-only memory (ROM), random access memory (RAM), magnetic disk storage media, optical storage media, flash memory devices, etc.).

Note that any and all of the examples described above can be combined with each other, except to the extent that it may be stated otherwise above or to the extent that any such examples might be mutually exclusive in function and/or structure.

Although the present invention has been described with reference to specific exemplary examples, it will be recognized that the invention is not limited to the examples described, but can be practiced with modification and alteration within the spirit and scope of the appended claims. Accordingly, the specification and drawings are to be regarded in an illustrative sense rather than a restrictive sense.

Examples of Certain Embodiments

To summarize, therefore, certain embodiments of the technology introduced herein are as recited in the following numbered examples:

1. A photodetector device comprising:
a first reflective region with a first reflectivity;
a second reflective region with a second reflectivity; and
a cavity including light absorption material, positioned between the first and second reflective regions so as to retain light passed through the first reflective region and reflected between the first and second reflective regions,
wherein the first reflectivity is configured to cause an amount of light energy that escapes from the first reflective region, after the light being reflected by the second reflective region, to be substantially zero.

2. The device of example 1, wherein the light enters the cavity and reflects between the first and second reflective regions, the light resonates in the cavity.

3. The device of any one of examples 1-2, wherein the first reflectivity is configured to be substantially equal to a one-circulation attenuation coefficient of the cavity, and wherein the one-circulation attenuation coefficient indicates a ratio of remainder light energy over entrance light energy in one circulation.

4. The device of any one of examples 1-3, wherein the first and second reflective regions are selected from a group comprising: a distributed Bragg reflector (DBR), a metallic reflector, a loop mirror, a corner mirror, and a reflection trench.

5. The device of any one of examples 1-4, wherein a structure of the cavity comprises a photodiode, or a p-i-n doping profile, or an avalanche photodiode layered structure.

6. The device of any one of examples 1-5, wherein the cavity, or the first reflective region, or the second reflective region comprises a group III-V compound, silicon, germanium, an organic material, or a combination thereof.

7. The device of any one of examples 7-8, wherein the first reflectivity is less than the second reflectivity.

8. A photodetector device comprising:
a first reflective region with a first reflectivity;
a second reflective region with a second reflectivity;
a cavity positioned between the first and second reflective regions, and
a waveguide coupled to the first reflective region;
a light absorption region disposed over at least part of the cavity so as to absorb light passed through the cavity,
wherein the first reflectivity is further configured to cause the amount of light energy that escapes from the first reflective region back to the waveguide, after the light being reflected by the second reflective region, to be substantially zero.

9. The device of any one of example 8, wherein the light enters the cavity and reflects between the first and second reflective regions, the light resonates in the cavity.

10. The device of any one of examples 8-9, wherein the first reflectivity is less than the second reflectivity.

11 The device of any one of examples 8-10, wherein the light absorption region, or the first reflective region, or the second reflective region comprises a Group III-V compound, silicon, germanium, an organic material, or a combination thereof.

12. The device of any one of examples 8-11, wherein a combined structure of the light absorption region and the cavity comprises a photodiode, or a p-i-n doping profile, or an avalanche photodiode layered structure.

13. A method for forming a photodetector device, the method comprising:
forming a cavity, a first reflective region, and a second reflective region over a substrate, wherein the cavity is formed between the first and second reflective regions; and
wherein a reflectivity of the first reflective region is configured so that an amount of incident light energy that escapes from the first reflective region, after the light being reflected by the second reflective region, to be substantially zero, and whereby the light resonances inside the cavity.

14. The method of example 13, further comprising:
forming a light absorption region adjacent to the cavity so as to absorb light inside the cavity.

15. The method of any one of examples 13-14, wherein the reflectivity of the first reflective region is less than the reflectivity of the second reflective region.

16. The method of any one of examples 13-15, wherein the material of the cavity, the first reflective region, the second reflective region, or the light absorption region is selected from one or more of: Group III-V compound, silicon, germanium, an organic material, or a combination thereof.

17. A means for forming a photodetector device, the means comprising:
means for forming a cavity, a first reflective region, and a second reflective region over a substrate, wherein the cavity is formed between the first and second reflective regions; and
wherein a reflectivity of the first reflective region is configured so that an amount of incident light energy that escapes from the first reflective region, after the light being reflected by the second reflective region, to be substantially zero, and whereby the light resonances inside the cavity.

18. The means of example 17, further comprising:
means for forming a light absorption region adjacent to the cavity so as to absorb light inside the cavity.

19. The means of any one of examples 17-18, wherein the reflectivity of the first reflective region is less than the reflectivity of the second reflective region.

20. The means of any one of examples 17-19, wherein the material of the cavity, the first reflective region, the second reflective region, or the light absorption region is selected from one or more of: group III-V compound, silicon, germanium, an organic material, or a combination thereof.

21. A photodetector device comprising:
a first reflective region with a first reflectivity, wherein the first reflective region includes a first dielectric layer;
a cavity region including (1) a light absorption layer containing germanium, and (2) a buffer layer containing silicon, wherein a dimension of the buffer layer is adapted based on a wavelength of incident light for a select bandwidth; and
a second reflective region with a second reflectivity that is larger than the first reflectivity, wherein the second reflective region includes (1) a reflective layer, and (2) a second dielectric layer positioned between the reflective layer and the cavity region, wherein a thickness of the second dielectric layer is adapted to increase the second reflectivity as compared to that of the second reflective region without having the second dielectric layer,
wherein the cavity region is positioned between the first and second dielectric layers so as to retain light passing through the first dielectric layer and reflected between the first dielectric layer and the reflective layer,
wherein the first reflectivity is configured to be substantially equal to a one-circulation attenuation coefficient, and
wherein the one-circulation attenuation coefficient indicates a ratio of remainder light energy over entrance light energy in one circulation.

What is claimed is:

1. A photodetector device comprising:
a first reflective region with a first reflectivity, wherein the first reflective region includes a first dielectric layer;
a cavity region including (1) a light absorption layer containing germanium, and (2) a buffer layer containing silicon; and
a second reflective region with a second reflectivity that is larger than the first reflectivity, wherein the second reflective region includes (1) a reflective layer including a coating of metal, and (2) a second dielectric layer positioned between the reflective layer and the cavity region,
wherein the cavity region is positioned between the first and second dielectric layers so as to retain light passing through the first dielectric layer and reflected between the first dielectric layer and the reflective layer, and
wherein the first reflectivity is configured to be substantially equal to a one-circulation attenuation coefficient.

2. The device of claim 1, wherein incident light enters the cavity and reflects between the first and second reflective regions, the incident light resonates in the cavity, and (a) the first reflectivity, (b) the second reflectivity, and (c) an attenuation coefficient of the cavity are collectively configured such that the first reflectivity is less than the second reflectivity.

3. The device of claim 1, wherein the first reflectivity is configured to cause an amount of light energy that escapes from the first reflective region, after incident light being reflected by the second reflective region, to be substantially zero.

4. The device of claim 1, wherein the first dielectric layer comprises a plurality of layers with alternating high and low refractive index pairs.

5. The device of claim 1, wherein the first dielectric layer comprises oxide, and wherein a thickness of the first dielectric layer is larger than 100 nm.

6. The device of claim 1, wherein the light absorption layer in the cavity region is thinner than 1.5 um and the buffer layer is thicker than 10 nm.

7. The device of claim 1, further including a layer of silicon between incident light and the first dielectric layer.

8. The device of claim 7, further including an anti-reflection coating layer between the layer of silicon and the incident light.

9. The device of claim 1, wherein the first and second reflective regions are respectively selected from a group comprising: a distributed Bragg reflector (DBR), a metallic reflector, a dielectric layer, a dielectric-metal layer, a loop mirror, a corner mirror, and a reflection trench.

10. The device of claim 1, wherein a structure of the cavity region comprises one or more of: a p-n doping profile, a p-i-n doping profile, a p-i-p-i-n doping profile, or a n-i-n-i-p doping profile.

11. The device of claim 1, wherein the cavity, or the first reflective region, or the second reflective region comprises a group III-V compound, silicon, germanium, an organic material, or a combination thereof.

12. The device of claim 1, further comprising:
a waveguide coupled to the first reflective region to guide incident light.

13. The device of claim 1, further comprising:
a substrate containing silicon.

* * * * *